United States Patent [19]
Duff

[11] Patent Number: 6,025,833
[45] Date of Patent: Feb. 15, 2000

[54] METHOD AND APPARATUS FOR VARYING THE INCREMENTAL MOVEMENT OF A MARKER ON AN ELECTRONIC DISPLAY

[75] Inventor: Christopher P Duff, Colorado Springs, Colo.

[73] Assignee: Hewlett-Packard Company, Palo Alto, Calif.

[21] Appl. No.: 08/826,838

[22] Filed: Apr. 8, 1997

[51] Int. Cl.[7] .............................. G09G 5/08; G09G 5/36; G01R 13/20

[52] U.S. Cl. ......................... 345/159; 345/134; 345/145; 324/121 R

[58] Field of Search .................................. 345/157, 175, 345/134, 135, 145, 146, 159; 600/525; 341/31; 73/465; 324/121 R

[56] References Cited

U.S. PATENT DOCUMENTS

| | | | |
|---|---|---|---|
| 3,824,382 | 7/1974 | Eshelman | 345/134 |
| 4,293,222 | 10/1981 | Caruso et al. | 345/157 |
| 4,364,080 | 12/1982 | Vidovic | 345/134 |
| 4,414,981 | 11/1983 | Wong et al. | 600/525 |
| 4,628,254 | 12/1986 | Bristol | 324/121 R |
| 4,743,845 | 5/1988 | Diller et al. | 324/121 R |
| 4,761,640 | 8/1988 | Slavin | 345/145 |
| 4,766,425 | 8/1988 | Tallman et al. | 345/175 |
| 5,039,937 | 8/1991 | Mandt et al. | 324/121 R |
| 5,119,076 | 6/1992 | Wilson | 345/134 |
| 5,298,890 | 3/1994 | Kanamaru et al. | 345/157 |
| 5,469,191 | 11/1995 | Smith, III et al. | 345/159 |
| 5,508,717 | 4/1996 | Miller | 345/145 |
| 5,596,347 | 1/1997 | Robertson et al. | 345/159 |
| 5,703,620 | 12/1997 | Keyson | 345/145 |
| 5,710,574 | 1/1998 | Jaaskelainen, Jr. | 345/159 |
| 5,808,604 | 9/1998 | Robin | 345/146 |

*Primary Examiner*—Jeffery Brier
*Assistant Examiner*—Paul A. Bell

[57] ABSTRACT

The method and apparatus of the present invention vary the rate of movement of a marker along a waveform. The rate of movement is varied by changing the distance increment the marker moves in response to a movement command. In a first embodiment of the invention the marker movement increment is proportional to the reciprocal of the derivative of the waveform amplitude with respect to time. In a second embodiment the marker moves only to specified points of interest along the waveform which are calculated in real-time. In a third embodiment the increment depends on how long the input device has been activated. In a fourth embodiment the marker movement is interrupted when the marker steps onto or over a detent. Each embodiment of the present invention moves the marker along the waveform in a manner which improves the ability of the user to examine information of interest in detail while moving rapidly over information that is not of interest.

60 Claims, 15 Drawing Sheets

METHOD AND APPARATUS FOR VARYING THE INCREMENTAL MOVEMENT OF A MARKER ON AN ELECTRONIC DISPLAY

BACKGROUND OF THE INVENTION

1. Field of the Invention

The present invention relates to the movement of a marker across an electronic display. More particularly, the present invention relates to varying the rate of marker movement across the electronic display. Still more particularly, the invention relates to varying the rate of marker movement along the displayed waveform of an oscilloscope.

2. Statement of the Problem

Electronic displays are used to display processed information to a user. For example, a computer running a word processor application shows the text that a user has entered into a document on a display. Typically, the position of a marker, such as a cursor, on the display indicates a specific point in the displayed information. In the text file example, the cursor indicates the position where a user is currently working. The marker simplifies the display by allowing the user to focus on a particular portion of the displayed information. Input devices, such as keys on a keyboard or a mouse, allow the user to move a cursor across the screen. The rate of cursor movement is responsive to input commands and is determined by a speed parameter in the software controlling the display. For example, on a typical computer display, the movement of the cursor responsive to a movement of the mouse is determined by a mouse setup file containing a cursor speed parameter.

Generally, the rate of marker movement responsive to an input is uniform with respect to both the input and displayed information. The uniform marker movement presents problems. A display may have some areas with very dense displayed information and other areas with sparse amounts of displayed information. Uniform movement with respect to an input causes great difficulty in moving a cursor to an exact point of the displayed information, while uniform movement with respect to the displayed information causes the cursor to not move to some positions on the display. The result of these problems is that the user does not have fine control over the marker movement to adequately investigate the displayed information.

One type of display where uniform cursor movement is a particular problem is a display on a digital oscilloscope. Oscilloscopes are signal analysis display devices. Typically, an oscilloscope displays the amplitude of a signal with respect to time from a trigger event. The display is usually in the form of a waveform with the amplitude on the y-axis and the time on the x-axis. A marker, conventionally called a cursor, moves across the waveform to indicate the signal amplitude at a specific time. A user studying a pulse waveform is typically concerned only with the leading and trailing waveform edges. The leading and trailing waveform edges represent portions of the waveform where the amplitude of the signal is changing significantly with respect to time. The flat portions of the waveform do not concern most users, since these portions represent little change in the amplitude with respect to time.

The leading and trailing waveform edges represent a small duration compared to the time of the overall waveform. Flat waveform portions typically last for a significantly longer duration of time than the critical waveform edges. A cursor moving across a waveform in uniform increments is not satisfactory to a user. If the cursor moves in increments small enough for the user to adequately examine the waveform edges, the cursor will not traverse the non-critical area in an acceptable amount of time. Conversely, if the cursor moves in large enough uniform increments to quickly traverse the flat portions, the user will not be able to study the leading and trailing edges with the desired degree of detail. For example, an edge of the waveform may last on the order of nanoseconds, while a flat portion may be of a duration on the order of microseconds. A cursor moving in uniform increments of nanoseconds would have a sufficient granularity to study the edges, however, the cursor would move through the flat portion for a very long period. A larger increment may cause the cursor to not be positioned along the waveform edge. Thus conventional cursor movement systems either miss significant features on the display or waste user time by displaying insignificant features.

Another problem that arises is the viewing of particular points of interest of a display. Some displays contain information that is not readily apparent from a plain viewing of the display. For example, the waveform display of an oscilloscope has 10%, 50%, and 90% threshold values along the waveform edges. A user viewing the waveform cannot discern these values with a high degree of accuracy. However, the user may desire to view these critical values since the values are used to calculate rise-time, fall-time, and frequency of the signal. Conventional cursor movement systems have no way to ensure that these points will be displayed to a user.

Typically, a processor reads input commands from an input device at uniform time intervals. The display of the marker movement sometimes lags behind the receiving of the input commands. Human response characteristics often result in the user commanding the marker to pass the desired position before the user can react and halt the input commands. A cursor system that ensures that a user views the marker at the desired position before inputting commands to move the marker would be highly desirable.

The above problems limit the user's ability to study critical information on electronic displays. Therefore, systems are needed to move a marker across all the displayed information in a manner that gives the user an ability to analyze desired information in detail.

3. Solution to the Problem

The above and other problems are solved by the present invention. Like conventional marker movement systems, the present invention moves a marker across the screen responsive to user commands. Unlike conventional systems, the present invention varies, in real-time, either: 1) the time interval between marker movement increments, and/or 2) the distance interval over which a movement increment is made, and responsive to either: a) visual display information and the position of said cursor on said display in relation to said visual display information; and b) a sequence of input commands. Varying the marker movement across the screen responsive to the displayed information ensures the user views critical portions of the display in sufficient detail. Varying of the marker movement responsive to user commands, allows the user to determine what portions of the display are viewed in detail.

In a first embodiment, the interval between marker positions changes depending upon the portion of the displayed information where the marker is located. In another embodiment the marker moves directly to critical portions of the displayed information. A third embodiment varies the marker movement depending on the length of time that an input command has been active. A fourth embodiment interrupts the movement of the marker at detent values associated with the displayed information.

In the first embodiment, when an input command to move the marker is received, data representing the current marker position is compared to the displayed information. If the marker is in a critical portion of the display having a high density of information, the interval between marker positions is small. If the marker is in a non-critical portion of the display having a sparse amount of information, the interval between marker positions is large.

In the preferred embodiment, when a movement command is received, data representing the current marker position is used to determine a velocity profile. The velocity profile is used to vary the marker movement. An algorithm may be used to determine the velocity profile. Along critical portions of the display, the velocity profile creates small intervals between marker positions. Conversely, when the current marker position is in a non-critical portion of the display, the velocity profile creates a large interval between marker positions.

A preferred embodiment of the first embodiment operates in the context of a waveform display of a digital oscilloscope. Generally, users consider the leading and trailing edges of the waveform to be the critical portions of the display and consider the flat waveform portions to be the less critical portions of the display. Along the waveform edges, the cursor has a smaller interval between displayed positions to slow movement of the cursor. As the cursor moves along the flat waveform portions, the cursor has greater intervals between displayed positions to increase speed of the cursor movement along these waveform portions. The result of varying intervals between the positions is that the critical waveform edges are reviewed with fine granularity for detailed study, while the cursor moves along the non-critical, flat portions in an acceptable amount of time.

In the preferred embodiment, the marker movement is related to the slope of a waveform that the cursor is traversing. That is, the critical and non-critical portions of the waveform are identified by the differential of the amplitude with respect to time. Positions on the waveform edges have large differentials with respect to the flat portions of the waveform. Along the non-critical waveform portions, the differential approaches zero. The large difference between the differentials along the two waveform portions allows the critical and noncritical portions to be easily identified. The interval between positions is made proportional to the reciprocal of the differential. The reciprocal is mapped to a velocity profile. Care is taken to ensure that edges are not skipped over, by finding the minimum velocity between the current marker location and the new marker location.

A second embodiment detects the position of specified critical values, or points of interest, in the displayed information and moves the marker to the position of the detected points of interest. A preferred embodiment of the second embodiment operates in the context of a waveform display of signals received by a digital oscilloscope. Specified critical values, such as the 10% threshold of the third rising edge, are stored in a database. A signal is received and stored by the oscilloscope. Critical values that the marker is assigned to are then read from the database. The oscilloscope determines the waveform position of currently assigned critical values from the signal. The waveform position of the critical value is then saved to a memory as the marker location. When a move cursor command is received, each specified critical value is read from the database. The oscilloscope determines the waveform position of each specified critical value from the signal. The marker then moves from one critical value to the next and the new critical value that the marker is assigned to is stored to the database. This embodiment minimizes marker movement and ensures the user reviews only the critical values of the display. User time is not wasted by moving the marker through insignificant values in the displayed information. Another advantage is the positions of critical portions of the displayed information may not be recognizable to a user viewing the display, yet the marker moves to these positions with minimal effort. Additionally, the marker tracks its assigned critical value as the signal changes.

In an example of the third embodiment, the incremental movement of the marker depends on how long input commands have been received from an input device. The number of time uniform input commands are counted, and are used to determine the length of time the user has been operating the input device. The determined amount of time is then mapped to a velocity profile. Data representing the current marker position is then applied to the velocity profile to determine the next marker position.

In the third preferred embodiment of the invention, an oscilloscope moves the cursor in the following manner. An oscilloscope displays a waveform with a cursor indicating the amplitude with respect to a particular time. A user holds down an increment key or decrement key. A counter is incremented each time the key is scanned. The number of counts is multiplied by a keystroke rate to determine the length of time the key was depressed. The interval between marker positions increases as the duration of time the key was depressed increases. The present invention also solves the problem of lag time between displaying of the marker at the new position and the inputting of new movement commands.

A fourth embodiment interrupts the receiving of commands from input devices, when a marker reaches a specified detent value in the displayed information. Detent values are displayed positions where a user typically stops the marker to view the displayed information. The interruption of input commands halts the marker movement at the position of the detent value. A user has time to react to the detent value position and stop inputting commands. After the interruption, the user may resume moving the cursor by inputting commands. The interruption gives a user finer control of cursor movement by allowing the user to precisely stop the cursor at the detent points. Varying the marker movement responsive to detent values permits the user to more accurately control the marker movement.

Each of the above embodiments enhances the use of interactive electronic displays by changing the rate of marker movement across the screen.

BRIEF DESCRIPTION OF THE DRAWINGS

The above and other advantages of the present invention may be better understood from a reading of the following description of the preferred exemplary embodiments of the invention taken in conjunction with the drawings in which.

DETAILED DESCRIPTION

Figure 1:
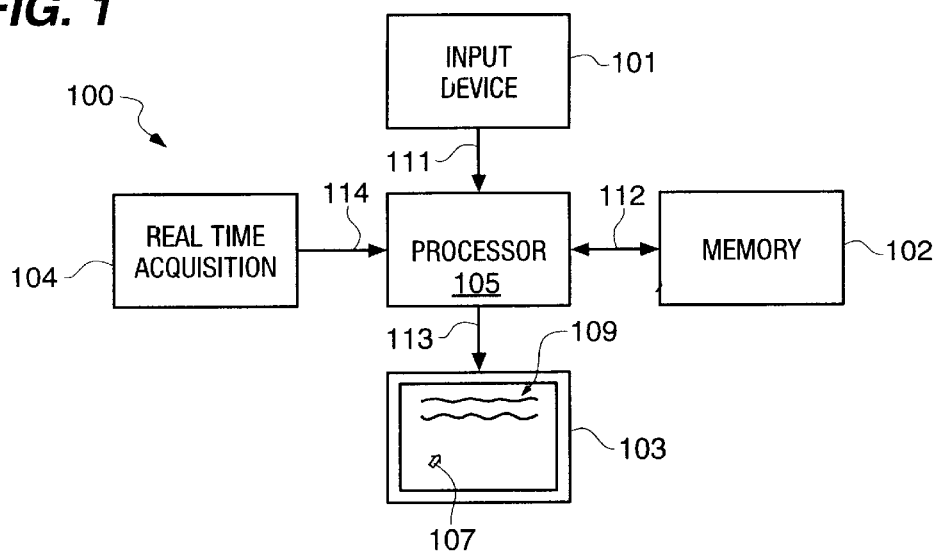
FIG. 1 is a block diagram of the principal hardware components of the preferred embodiment of the present invention.

The present invention controls marker movement across a display of information and is preferably embodied in software or in software and hardware components. In this disclosure the term cursor means a visible object that generally may be moved horizontally and vertically by an input device, generally a keyboard, and shows the point where information may be inserted into or extracted from a display system. The term pointer means a visual object that can be moved in any direction on a display by an input device, generally a mouse, to indicate a point of interest in the displayed information. A scroll marker is a visual object on an electronic display that indicates the position the object presently displayed occupies in a sequence of scrolled objects. In this disclosure the term marker includes all of the above visual objects and their equivalents. The term marker does not include any visual object or indicator that cannot be moved via a manual input device. The term manual input device means a keyboard, a mouse, a joy stick, a spin control, a touch pad, a roller ball, or any other device that includes some form of manual action to initiate the marker movement. This of course includes devices, such as spin controls, that utilize software controllers that act in response to some form of manual direction.

This disclosure concerns novel apparatus and methods for changing the increments with which a marker moves across a display. The increment can be either a time increment, a spacial increment, or both. In terms of time, the invention can be expressed as changing in real-time the rate at which a marker moves across a display. In terms of spacial increments, the invention can be expressed as changing in real-time the distance the marker moves in response to each marker movement command. In the embodiments discussed herein, the time between each marker movement is the same, assuming a continuous sequence of marker movement commands, so changing the distance the marker moves for each command also changes the rate of marker movement. The invention can also be implemented in a system in which the time between marker movement input commands is changed. In any embodiment, the term marker movement increment, sometimes referred to herein as increment for short, means the amount the marker moves, in time or space, in response to a single marker movement command.

As will be seen in detail below, according to the invention, the marker movement increment depends on the visual information displayed on the display screen. The marker, of course, is also displayed on the screen. To differentiate between the marker and the other visual information, we shall refer to all the information on the display except the marker as base visual information. In some computer displays it has been known to move the marker between certain fixed positions on the screen, such as data entry boxes on a menu. If the positions of such boxes in the display can be varied at all, it can only be varied by using some other portion of the program, such as the set-up portion. Thus, these positions cannot be varied in real-time. To differentiate from such systems, we introduce the term, real-time variable information, which is usually used to refer to real-time variable base visual information. Real-time variable information on a display is display information that is capable of varying without the user going to some other portion of the program or a different program.

In this disclosure real-time has its conventional meaning, as for example it is defined in The *McGraw-Hill Dictionary of Scientific and Technical Terms*, Fifth Edition, 1994, page 660. It means that the output of the data processing system is produced not later than when it is needed for effective control; with respect to a computer operation it means the programmed response is essentially simultaneous with the event itself. In terms of the present invention, it means that the experienced change in marker movement rate occurs essentially simultaneously with the user command.

FIG. 1 is a block diagram illustrating a generalized display system 100 in which the present invention is implemented. Display system 100 includes a manual input system 101, a memory 102, a video display system 103, an electronic processor 105, and a real time acquisition device 104. Memory 102 contains software instructions which embody the method of the invention, and which will be described in detail below. Real-time acquisition device 104 provides signals in real-time to processor 105 over path 114. Processor 105 reads from and writes to memory 102 over path 112. Input system 101 sends input signals to processor 105 over path 111. Responsive to the signals input from real-time acquisition device 104, and input device 101, and under control of software stored in memory 102, processor 105 generates electronic information signals and sends the signals to video display system 103 over path 113 where the signals cause the display system 103 to visually display information in real-time.

The display information includes both information as to the configuration and position of a marker or cursor 107 and other visual information 109 of interest to the user. In this disclosure, we refer to the information relating to the marker as marker information and all other information, i.e. non-marker information, as base visual information. Following the software of the present invention, the processor 103 utilizes base visual information as well as commands from input device 101 to vary the movement of cursor 107 on display 103.

Figure 2:
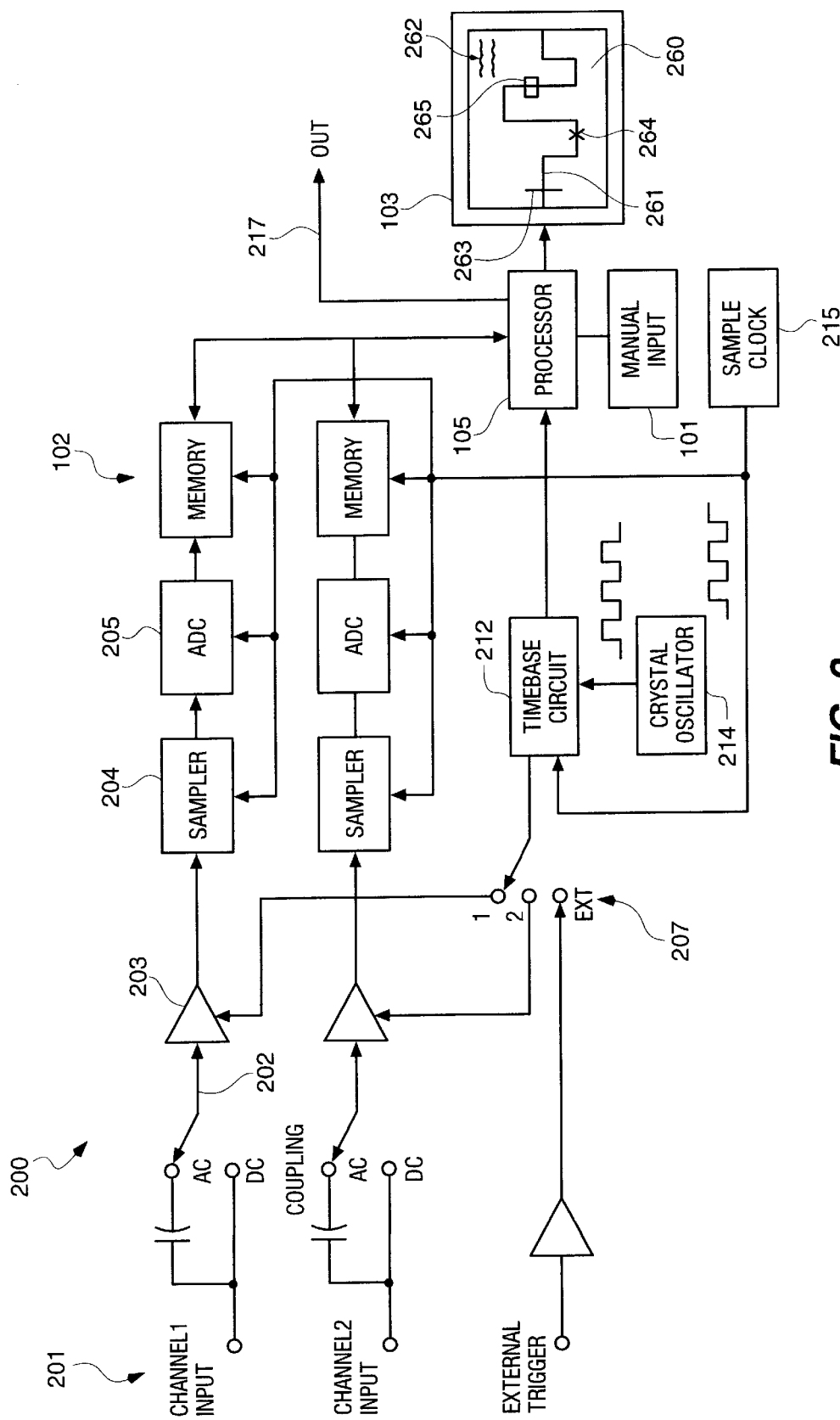
FIG. 2 is a block diagram of the present invention as embodied in a digital oscilloscope.

The invention may be implemented in a variety of actual devices that follow the general form of the display system 100. FIG. 2 illustrates a typical device embodying the present invention, i.e. a digital oscilloscope 200. Oscilloscope 200 includes inputs 201, each of which is connected via an input line, such as 202 to a preamplifier, such as 203, samplers, such as 204, analog to digital convertors, such as 205, selector switch 207, timebase circuit 212, crystal oscillator 214, and sample clock 215, in addition to memory 102, display 103 and processor 105. Oscilloscope 200 receives signals from an external source (not shown) over paths 201. Analog to digital convertor 205 receives the signals from sampler 204, converts the signals to digital data and transmits the digital data to memory 102 which is in communication with processor 105.

Processor 105 generates display information and sends it to display 103 to show a waveform 261 on screen 260 representing the received signals. When processor 105 receives a move marker signal from input device 101 it uses the instructions read from memory 102 to determine the next marker position using increment information stored in memory 102 and the move marker signal. When the next marker position is determined, information about the next position is sent stored in memory 102. Alphanumeric information about the marker position is also generated by processor 105 using instructions from memory 102 and stored in the memory. Processor 105 then combines the generated waveform information, alphanumeric information, and the marker position to generate a display on screen 260. An illustrative display is shown on the screen 260 in FIG. 2. Screen 260 has a display comprising waveform 261, alphanumeric information 262, and cursors 263–265. Cursors 263–265 illustrate the different types of symbols, such as lines, boxes, or X's, which may be used as markers to display positions on a display. Alternatively the display contains a single marker, such as 263, movable across waveform 261.

Figure 3:
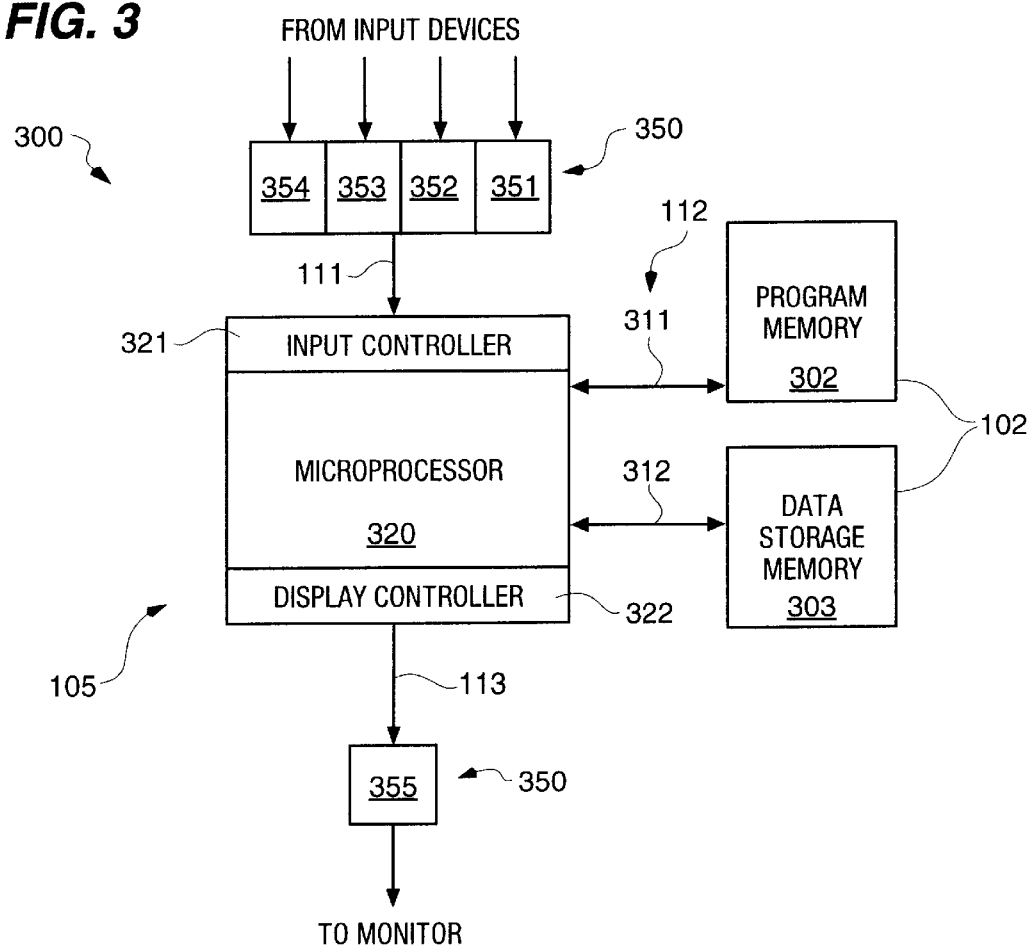
FIG. 3 (following FIG. 1) is a block diagram showing the data flow in an embodiment of the present invention implemented in a personal computer.

Another device in which the present invention may be implemented is a personal computer 300, which is illustrated in FIG. 3. Personal computer 300 includes ports 350 in addition to processor system 105, display system 103 (FIG. 1), input system 101, and memory 102. Processor system 105 includes a microprocessor 320, an input controller 321, and a display controller 322. Memory 102 comprises a memory 302 for storing application instructions and data storage memory 303 to provide real-time movement of the marker, memories 302 and 303 are preferably different portions of a single memory device, preferably a dynamic random access memory, but they are separated out in FIG. 3 so as to better illustrate the invention. Input controller portion 321 of processor 105 is connected to input devices (FIGS. 4 and 5) via ports 351 through 354. Microprocessor 320 is connected to program memory 302 via path 311 and to data storage memory 303 via path 312. Video display 103 is connected via port 355 to display controller portion 322 of processor 105.

Figure 4:
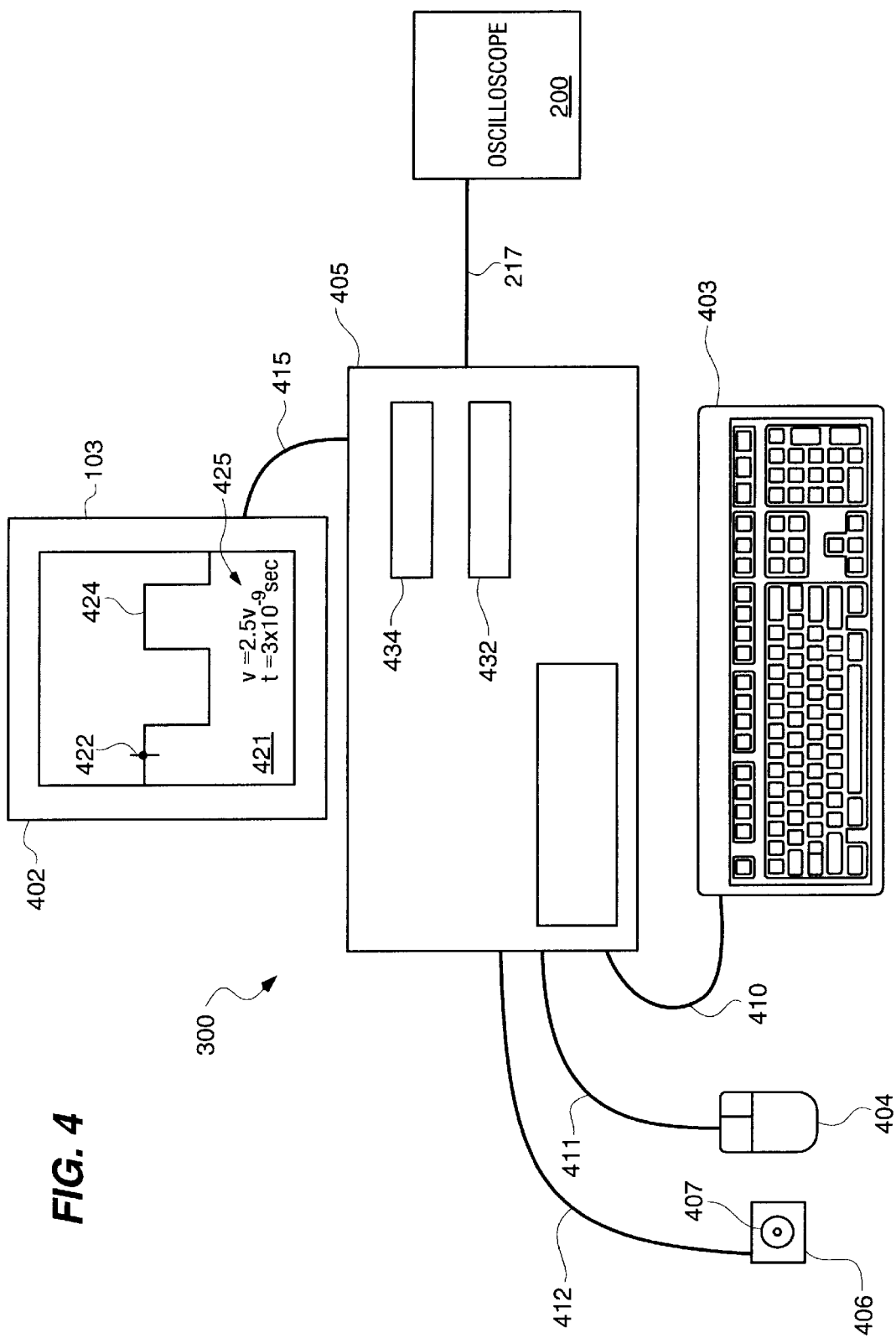
FIG. 4 (following FIG. 2) discloses a front view of a personal computer embodying the invention.
Figure 5:
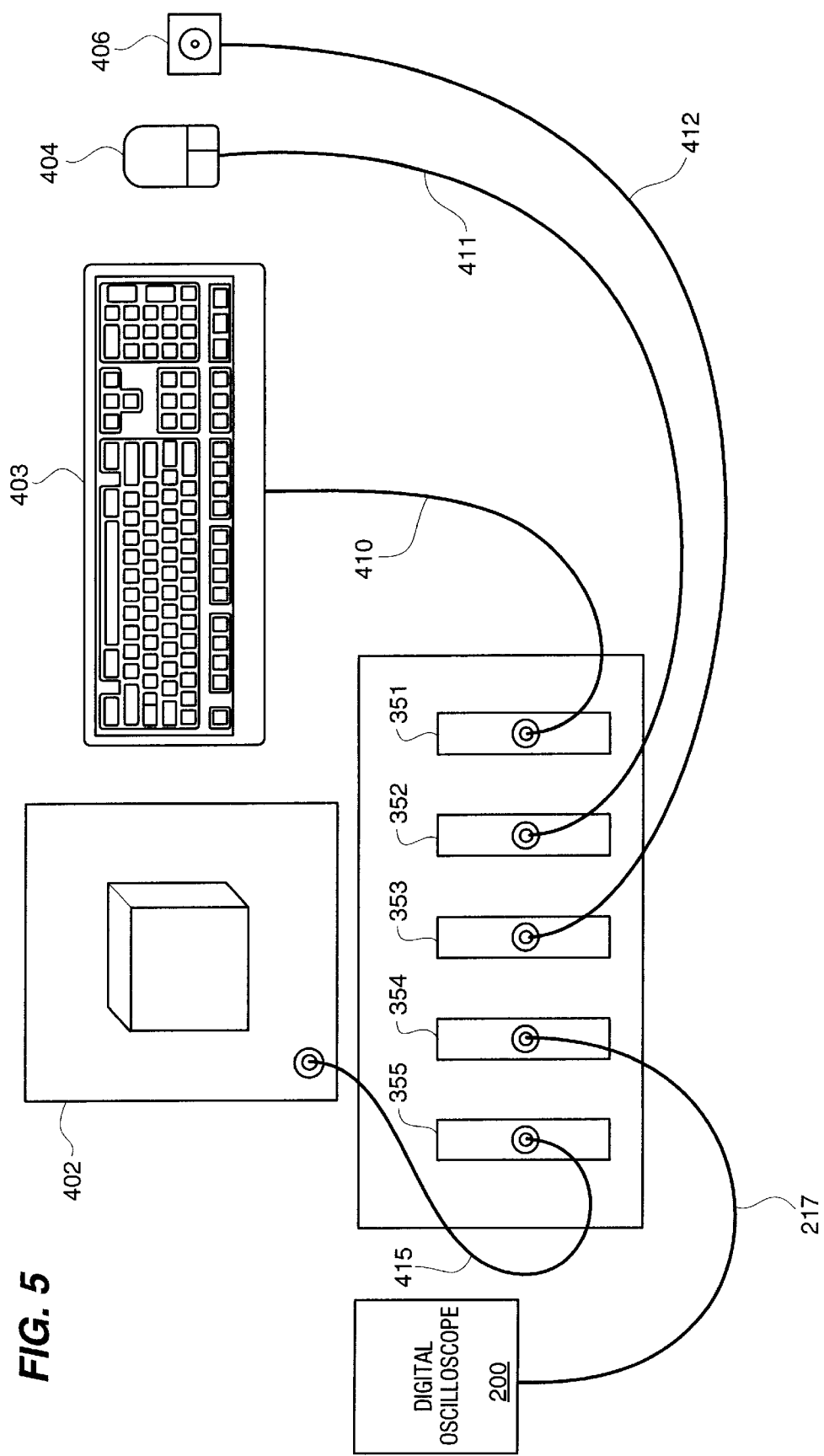
FIG. 5 discloses a rear view of the personal computer embodying the invention.

A particular implementation of a personal computer 300 that has been used to embody the present invention is illustrated in FIG. 4. In this implementation, the computer 300 is used to process and display a waveform received from an oscilloscope 200. Processor unit 405 houses all of the processor hardware components of personal computer 300, including microprocessor 320, input controller 321, video controller 322, and memory 102. As known in the art, microprocessor may be an Intel™, DEC™, Motorola™ or other suitable microprocessor. In the preferred embodiment, the microprocessor is a dual processor. However, the division of the processor into two physical units does not play an essential role in the invention, so for simplicity and ease of description the microprocessor will be referred to in the singular herein. In the preferred embodiment, input controller 321 is generally an input controller board, video controller 322 is generally a video board, and memory 102 generally includes a RAM (not shown), a hard drive 432, and a floppy drive 434, and may also include other conventional computer peripheral devices, such as a CD-ROM. Personal computer 300 has input devices comprising, but not limited to, keyboard 403, mouse 404, and control paddle 406. Video display 103 in personal computer 300 is monitor 402. Other devices such as digital oscilloscope 200 may attach to input device controller 321 via port 354. FIG. 5 illustrates ports 350–354 connected to keyboard 403, mouse 404, control paddle 406, and digital oscilloscope 200, respectively, via cables 410–412 and 217, respectively, and monitor 402 connected to port 355 via cable 415. In this implementation processor 105 receives a signal from attached oscilloscope 200 along cable 217 and via port 354 and input controller 321. Processor 105 stores the signal from oscilloscope 200 in program memory 303 over path 312. The processor refers to the signal in memory 303 as needed to determine the position of cursor 422, the details of which will be discussed below.

In FIG. 4, monitor 402 is shown displaying a waveform 424 on screen 421 generated from signals received from digital oscilloscope 200. Cursor 422 is a vertical line marking a specific position along waveform 424. Alphanumeric information 425 displays information relating to the waveform at the position of cursor 422 along waveform 424, such as the amplitude in volts and the time from a trigger event in seconds.

Figure 6:
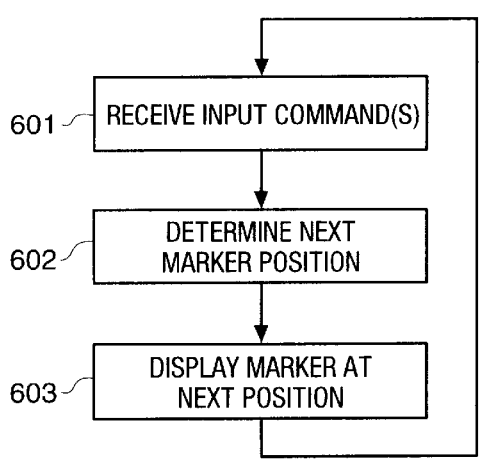
FIG. 6 discloses a generalized flow chart of the process according to the present invention.

In each of the above implementations of the invention, the movement of the marker 107, 263–265, and 422 is determined by instructions stored in memory 102. FIG. 6 shows a generalized flow chart of the preferred embodiment of a process 600 according to the present invention governed by the software instructions. In step 601, at least one move marker signal is received by processor 105 (FIG. 1) from input device 101 along path 111. In step 602, processor 105 then retrieves instructions from memory 102 along path 112, and determines the next marker position based on the instructions and the current position of the marker, plus either the displayed information, the user command(s), or both. In step 603, processor 105 sends the information about the next marker position to video display 103 along path 113 and the display is updated to display the marker at the next position. The program flow then returns to step 601. Any embodiment of the present invention will perform each of the three steps of process 600, though not necessarily in the order shown. Details of each step for four exemplary preferred embodiments shall be described below.

Figure 7:
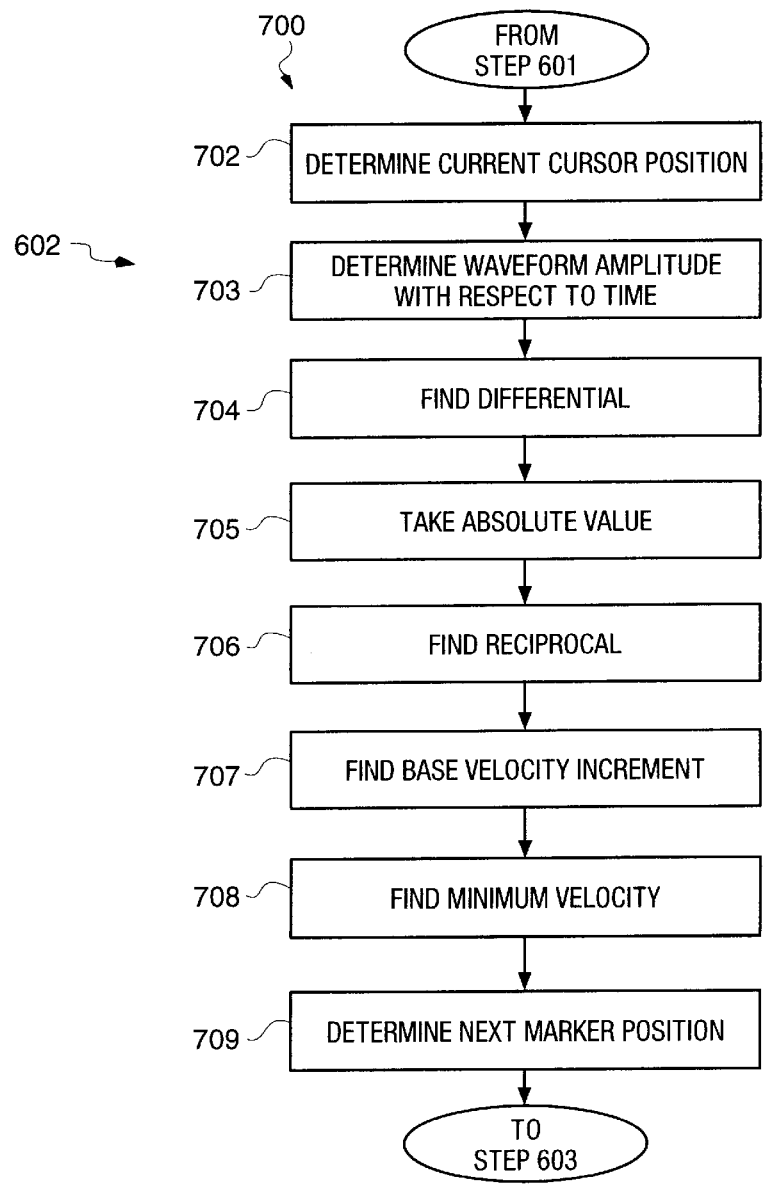
FIG. 7 discloses a flow chart describing a software program varying marker movement across a display responsive to variable display information.

According to a first embodiment of the invention, the rate at which a cursor moves in response to a cursor move command is varied depending on the base visual information displayed on the screen at and adjacent to the current position of the cursor. The rate of cursor movement is varied by changing the space interval, or increment, between marker positions. The time interval in which each increment of marker position is made stays constant. Thus, the marker appears to move slowly along the waveform when the increments between cursor positions are small. When the increments between marker positions are great, the marker appears to move quickly along the waveform. FIG. 7 shows a flow chart 700 illustrating the preferred embodiment of step 602, i.e. the determination of the next marker position. In the discussion of this embodiment, we shall refer to the display shown on monitor screen 421 in FIG. 4, though the display shown on oscilloscope screen 260 of FIG. 2 could be used as well. In Step 702, processor 105 determines the position of the cursor with respect to the waveform by receiving display data from dynamic memory 303 along path 312. In step 703, processor 105 then determines the waveform amplitude as a function of time for the region of the waveform adjacent the cursor position. After the waveform amplitude and waveform time of the cursor position are known, processor 105 determines the differential of the signal amplitude with respect to time in step 704 and stores it in memory 303. In step 705 the processor takes the absolute value of the differential, and then in step 706 inverts it to determine the reciprocal of the differential. To prevent division by zero, in this step, if the absolute value of the differential is zero, the program sets the reciprocal to a fixed number, which will generally be larger than any of the other reciprocals that may be determined. The resulting reciprocal is written to memory 303. Following the software instructions, processor 105 then maps the reciprocal to a velocity profile in step 707. Preferably, this is done using a mathematical algorithm, though it also may be done by mapping to a table stored in database memory 303. This mapping determines a base velocity increment. The base velocity increment is used to establish a range of marker locations in which provisional velocity increments are found. The minimum increment of these provisional increments is then selected to be the marker movement increment. That is, in step 708 a provisional velocity is found for each of the data points from the current marker location to a marker location that would be moved to if the cursor moved the base increment. The minimum of these provisional velocity increments is selected as the marker movement increment. This is accomplished by repeating steps 704 through 707 for the interim data points over the range from the current marker location to the marker location determined by the base increment, and finding the minimum of the provisional velocities found for all the interim data points. In step 709, the next marker position is determined from the combination of the direction of marker movement directed by the most recent input command, the current position of the marker, and the minimum increment obtained from the algorithm. The program flow then proceeds to step 603.

Figure 14:
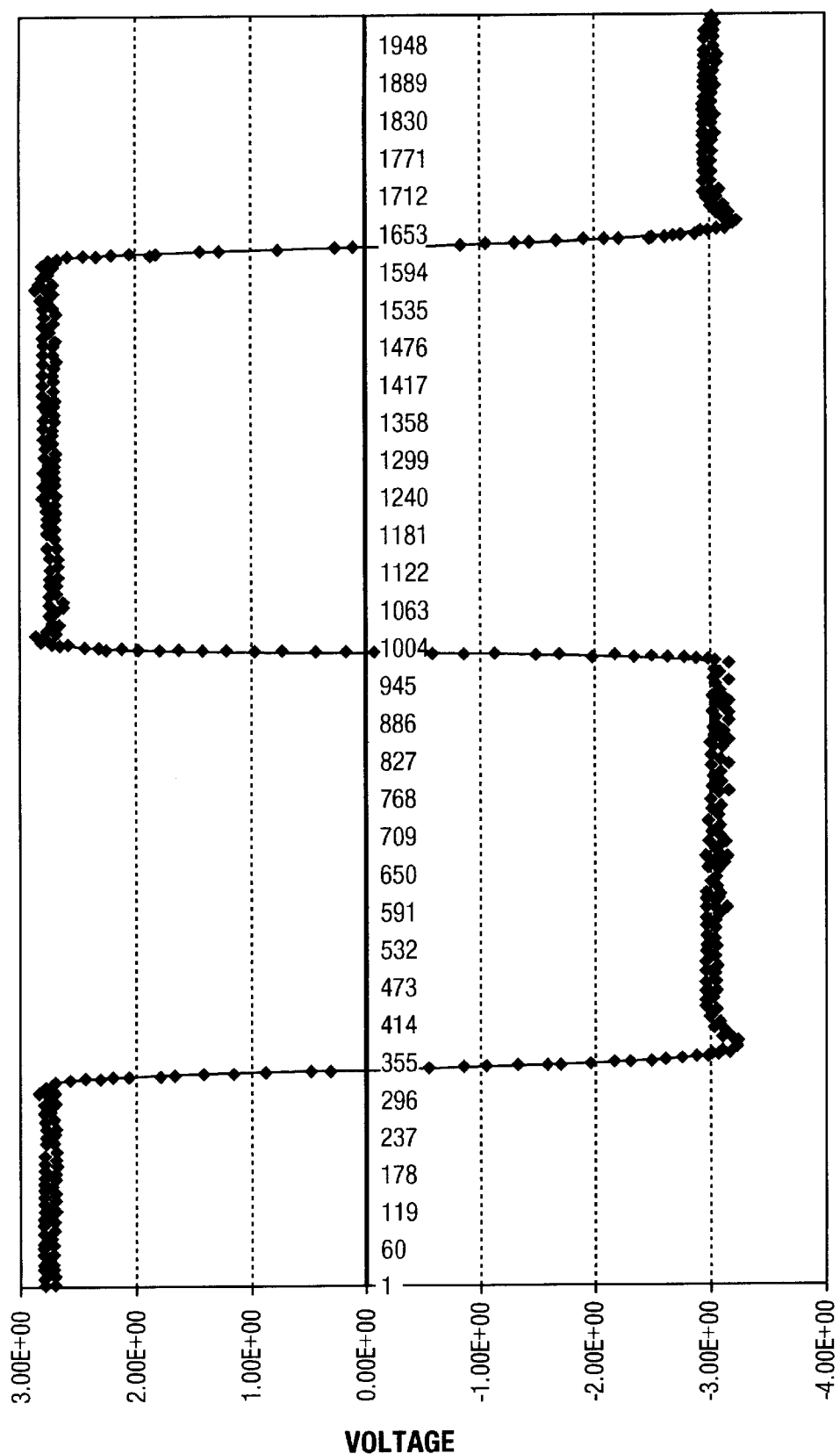
FIG. 14 is a graph of amplitude in volts versus data points for an exemplary waveform on an oscilloscope display.
Figure 15:
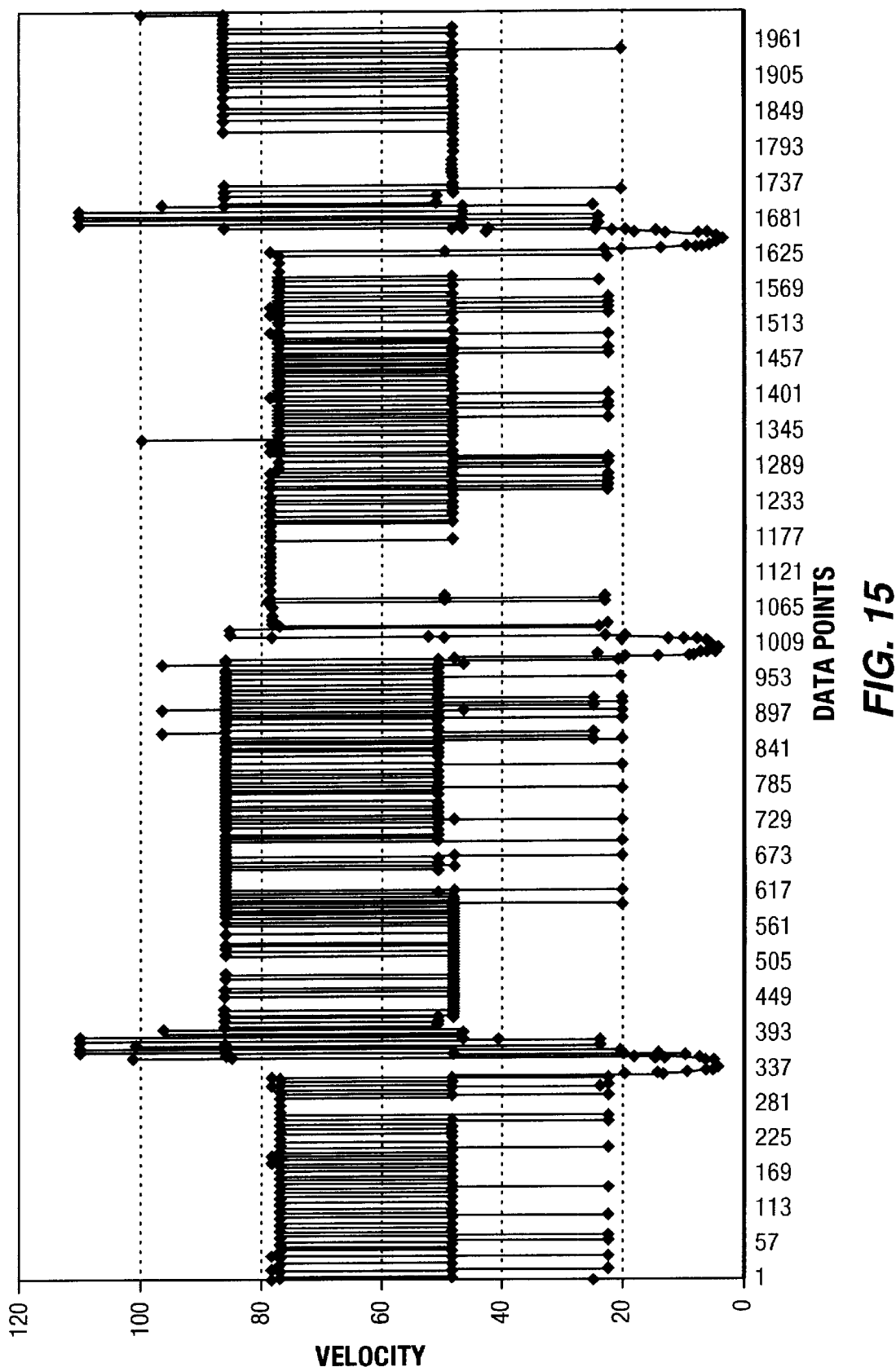
FIG. 15 shows a velocity profile for an embodiment of the invention as disclosed in FIG. 7 as applied to the waveform of FIG. 14.
Figure 16:
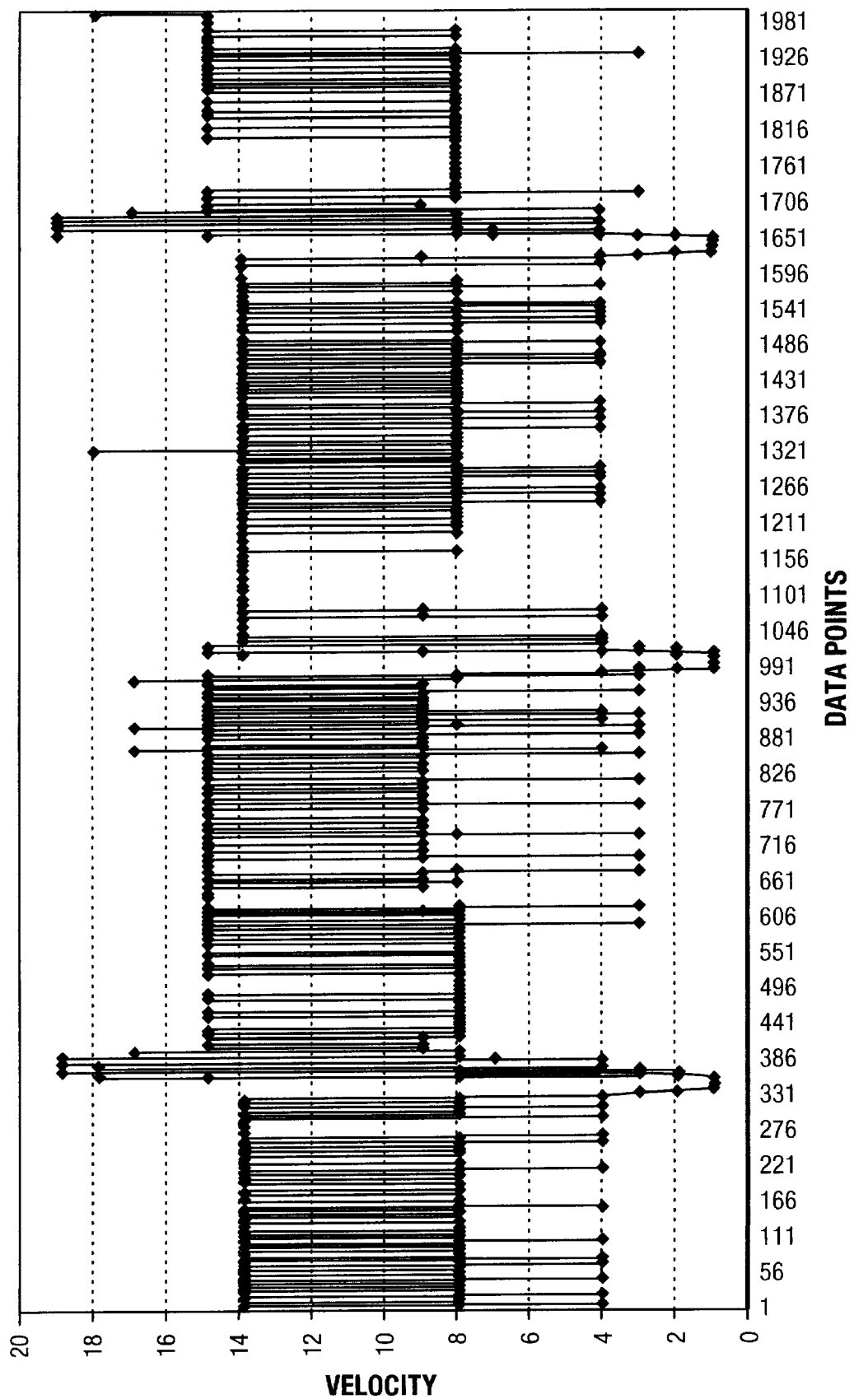
FIG. 16 shows a scaled velocity profile for an embodiment of the invention as disclosed in FIG. 7 as applied to the waveform of FIG. 14.

An example of the determination of the cursor velocity increments according to the first preferred embodiment of the invention is illustrated in FIGS. 14–16 and Table I for an actual waveform. The waveform for which the cursor velocity increments were determined is shown in FIG. 14 as a function of amplitude in volts versus the position along the horizontal direction of the monitor 402 screen in terms of data points. That is, the horizontal axis is broken up into 2004 equal spacial increments and the "data point" is the number of the increment starting from the left edge of the display.

TABLE I

| Data point | A Waveform amplitude in volts | B Differential; B1=(A3−A1)/2; Bi=[(Ai+1)−(Ai−1)]/2; B2004=(A2004−A2002)/2 | C Ci=ABS(Bi) | D Prevent Divide by zero and clip value; IF (Ci=0, Di=100); Di=1/Ci; Di= ROUNDUP (1/Ci) | E Scaled values |
|---|---|---|---|---|---|
| 1 | 2.73E+00 | −1.28E-02 | 0.01275275 | 79 | 14 |
| 2 | 2.77E+00 | −0.01275275 | 0.01275275 | 79 | 14 |
| 3 | 2.71E+00 | −0.0209712 | 0.0209712 | 48 | 8 |
| 4 | 2.73E+00 | 0.01275275 | 0.01275275 | 79 | 14 |
| 5 | 2.73E+00 | −0.01275275 | 0.01275275 | 79 | 14 |
| 6 | 2.71E+00 | 0.0209712 | 0.0209712 | 48 | 8 |
| 7 | 2.77E+00 | 0.01275275 | 0.01275275 | 79 | 14 |
| 8 | 2.73E+00 | 0.01296525 | 0.1296525 | 78 | 14 |
| 9 | 2.80E+00 | 0.0209712 | 0.0209712 | 48 | 8 |
| 10 | 2.77E+00 | −0.01296525 | 0.01296525 | 78 | 14 |
| 11 | 2.77E+00 | 0.01296525 | 0.01296525 | 78 | 14 |
| 12 | 2.80E+00 | 0.01296525 | 0.01296525 | 78 | 14 |
| 13 | 2.80E+00 | −0.01296525 | 0.01296525 | 78 | 14 |
| 14 | 2.77E+00 | −0.01296525 | 0.01296525 | 78 | 14 |
| 15 | 2.77E+00 | 0.01296525 | 0.01296525 | 78 | 14 |
| 16 | 2.80E+00 | −0.0209712 | 0.0209712 | 48 | 8 |
| 17 | 2.73E+00 | −0.0466892 | 0.0466892 | 22 | 4 |
| 18 | 2.71E+00 | 0.0209712 | 0.0209712 | 48 | 8 |
| 19 | 2.77E+00 | 0.01275275 | 0.01275275 | 79 | 14 |
| 20 | 2.73E+00 | −0.0209712 | 0.0209712 | 48 | 8 |
| 21 | 2.73E+00 | 0.0209712 | 0.0209712 | 48 | 8 |
| 22 | 2.77E+00 | 0.0209712 | 0.0209712 | 48 | 8 |
| 23 | 2.77E+00 | −0.0209712 | 0.0209712 | 48 | 8 |
| 24 | 2.73E+00 | −0.0209712 | 0.0209712 | 48 | 8 |
| 25 | 2.73E+00 | 0.0209712 | 0.0209712 | 48 | 8 |
| 26 | 2.77E+00 | 0.0209712 | 0.0209712 | 48 | 8 |
| 27 | 2.77E+00 | 0.01296525 | 0.01296525 | 78 | 14 |
| 28 | 2.80E+00 | −0.0209712 | 0.0209712 | 48 | 8 |
| 29 | 2.73E+00 | −0.01296525 | 0.01296525 | 78 | 14 |
| 30 | 2.77E+00 | 0.0209712 | 0.0209712 | 48 | 8 |
| 31 | 2.77E+00 | 0.01296525 | 0.01296525 | 78 | 14 |
| 32 | 2.80E+00 | 0.01296525 | 0.01296525 | 78 | 14 |

Table I

In Table I the details of the software determination of the base velocity increments are given. This data was found for all 2004 of the data points but is given just for the first 32 data points, since this is enough to illustrate the method. In column A the amplitude of the waveform for each data point is given in volts. In column B the differential corresponding to the data point is given. The formula used for the calculation of the differential is given at the top of the column. In this and other formulae in the table, a value for a cell is indicated by first giving the column and then the number of the data point corresponding to the row in which the cell is located. For example, as indicated at the top of column B, the entry in cell B1, that is, the entry in the row of column B corresponding to data point No. 1, is equal to the difference between the value in cell A3 and the value in cell A1 divided by 2. For the row corresponding to the $i^{th}$ row in column B, i.e. cell Bi, the value is determined by subtracting the value in the i+1$^{th}$ row of column A from the value in the i−1$^{th}$ row of column A and dividing by 2. The entry in cell B2004 is equal to the difference between the value in the 2004$^{th}$ row of column A and the 2002$^{th}$ row of column A divided by 2. In column C of Table 1, the absolute value of the differential at the corresponding data point is given. As indicated in the second row of column C, this is just equal to the absolute value of the number in the corresponding row of column B. In column D of Table 1, the reciprocal of the corresponding differential is given. The reciprocal for the cell in the $i^{th}$ data point in column D is found by dividing the value in the row corresponding to the $i^{th}$ data point in column C into 1. However, to prevent division by zero, if the value in the cell Ci=0, then Di is set equal to 100. If the data will not be scaled in column E (see below) then the data in column D should be rounded to the next highest whole number so the cursor moves only to predetermined data points along the screen 421. A ROUNDUP function that rounds the value in column D to the next whole higher number performs this operation.

The reciprocal of the differential determined in the paragraph above is a base increment value which is used to look ahead or behind in Table I by the base increment indicated to find the minimum reciprocal. For example, if the cursor is currently at the location of data point 16 and is commanded to move right on screen 421, i.e. forward through the data, the reciprocal of the differential is found for data point 16. The value in column D of Table I for data point 16 indicates that 48 data points is the base velocity increment. This requires that, in step 708, the reciprocal of the differential values be computed for the next 48 data points, i.e. for points 17 through 64, and the minimum of these reciprocals be found. If the command is a command to move to the left on screen 421, then the minimum of the reciprocals for the data points 1 through 15 is found, since no points prior to point 1 exist.

The minimum reciprocal value is used as an increment in number of data points which the cursor moves in response to the command received in step 601. For example, if the minimum reciprocal value for the range of points 16 through 64 is 22, then the cursor will move 22 points, i.e. from point 16 to point 38 in response to a move right command received in step 601. If the command is to move to the left, then the minimum reciprocal value is 48, and the cursor moves to the first data point, since it cannot move further. Since the time in which the cursor moves is the same for any increment, the increment calculated by the above algorithm represents a rate of movement, and since there is a direction involved with each movement, depending on the direction associated with the input command, the increments also represent a "velocity" for the data point corresponding to the row. FIG. 15, shows the base velocities for an embodiment of the invention in which the value in column D of Table I is taken as the base velocity over which to find the minimum. The minimum velocity is then applied to the current data point as the "velocity" assigned to that data point for a given direction. The ordinate is the range over which the reciprocals are found to find the minimum velocity in either the left or right direction. The minimum velocity is the value to be incremented from the current position when the move command is given. The abscissa is the number of the initial (current) data point. The points shown on the graph are the data points, though most of the data points overlap and thus are not individually distinguishable.

As can be seen from the curve of FIG. 15, many of the velocities are relatively high, some being over 100 data points per time interval. Thus, the minimum velocity could be over 80 for a collection of data points. Thus the cursor may move too quickly over areas of little interest on screen 421. Thus, preferably, the values in column D are scaled using a scaling algorithm before using them as velocities and base velocity increments. An example of a scaling algorithm is:

$$Ei = \text{Roundup}[(Di-Dmin) \times (Vmax-Vmin)/Dmax-Dmin], \quad (1)$$

where Ei is the scaled value of the velocity, Roundup is a function which rounds the value in square brackets to the next higher whole number, Di is the value corresponding to the $i^{th}$ data point in D column, Dmin is the minimum value in column D, Dmax is the maximum value in column D, Vmax is the maximum desired value of the scaled velocity, and Vmin is the minimum desired value of the scaled velocity. For the example of Table I (including all 2004 data points), Dmin is 3 and Dmax is 111. Using equation 1, a Vmax of 20 data points per time interval and a Vmin of 1 data point per time interval, the resulting scaled values for the first 32 data points are given in column E of Table I. The Roundup operation need not be used to compute the values in column D if the values will be scaled as in column E. FIG. 16 shows the base velocity profile for all 2004 of the data points for the waveform of FIG. 14 calculated as just described. Again, the ordinate is the range over which to find the minimum velocity in either the left of right direction. The minimum velocity in this range is the value to be incremented from the current location in response to the move cursor command. The abscissa is the number of the base velocity data point. Again, the data points overlap, and many are not individually distinguishable.

In the first preferred embodiment just described, the interval size is varied responsive to the position of the marker relative to the displayed waveform. This causes the cursor to move across the screen slowly in the steep portions of the waveform, and move more quickly across the flat portions of the waveform. This permits the user to study the more important portions of the waveform in more detail. An important feature of this embodiment is that the minimum velocity increment for a range of data points is selected as the cursor increment when it is moved. This prevents the cursor from completely jumping over areas of significant interest.

In a second embodiment of the invention, the cursor moves directly from one critical area of the waveform to the next. This embodiment of the invention will also be discussed in connection with the implementation shown in FIG. 4 in which a waveform display 424 is generated by personal computer 300 from the signals received from digital oscilloscope 200. In this embodiment, the instructions stored in memory 302 move a cursor to specified critical values along the waveform 424. Examples of critical values in an oscilloscope waveform display are the 10%, 50%, and 90% threshold values along the waveform edges. Such critical values may not be obvious to a user viewing the display.

Figure 8:
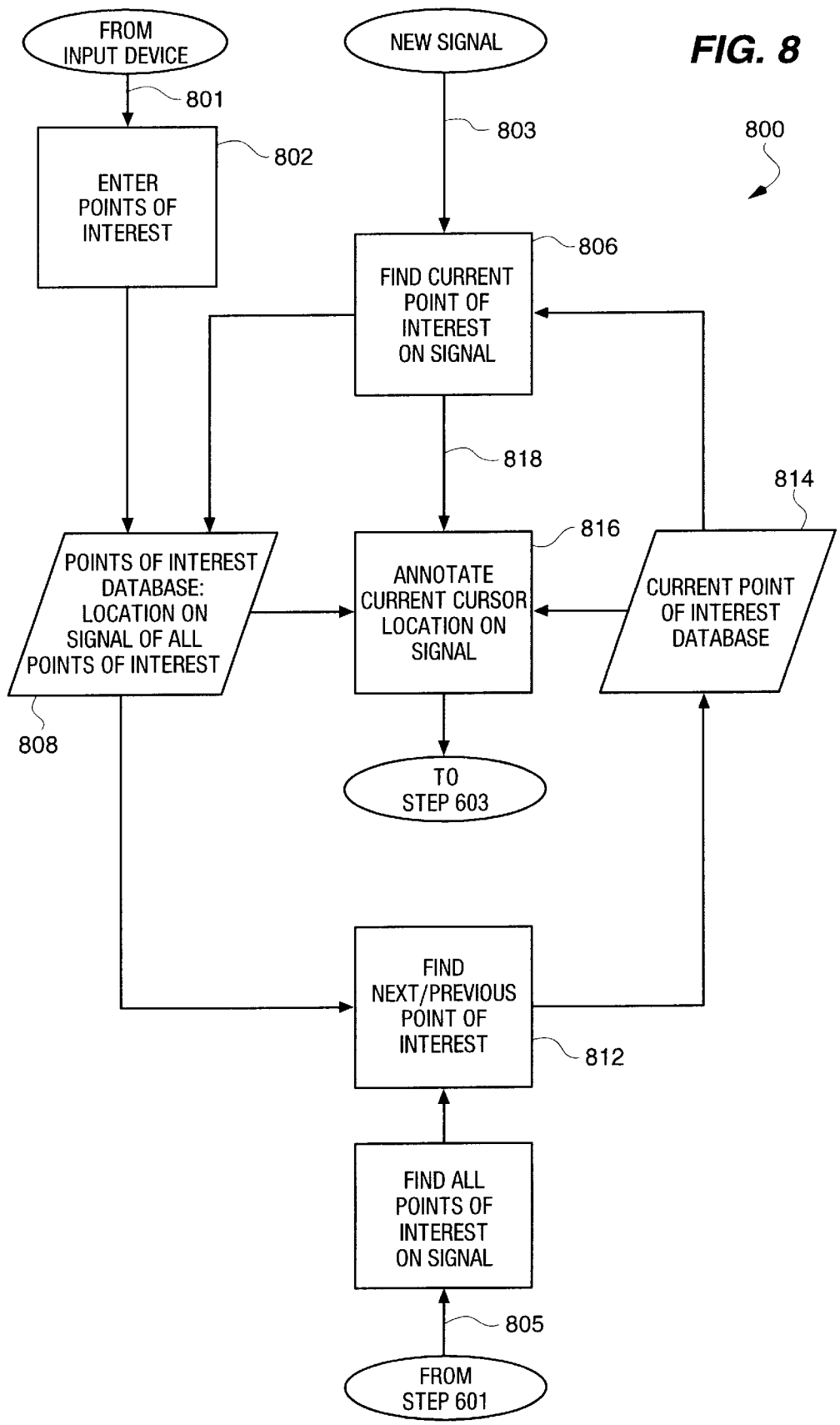
FIG. 8 is a functional flow diagram illustrating the interaction of the principal system elements and process steps according to the invention for moving a marker between predetermined variable points of information on a display.

FIG. 8 is a functional flow diagram showing the functional interaction of the principal system elements and process steps used to move the cursor to the position of each critical value. In this process, input from three sources is analyzed to determine the cursor position. One source is an input device 101 with which information on the points of interest is entered. This is generally a keyboard 403 or a mouse 404, but may also include a storage device, modem, or other input device. This first source is utilized to input points of interest to the program along path 801. Another source is the oscilloscope signal stored in memory 303 which is received along input path 803; a third source is again an input device, such as keyboard 403 or mouse 404, from which the command to change cursor position, which is received via path 805 from step 601, is received. Two databases 808 and 814 are also employed in this process. Point of interest (PI) database 808 is preferably a table set up in memory 303, and records both the definition of the critical points (points of interest) and the location of these points on the waveform 424. Current point of interest (CPI) database 814 is preferably a memory location in memory 303 at which the current point of interest is stored. These databases may also be implemented as registers, counters, or other electronic elements that can store information. FIG. 8 shows the principal steps of this embodiment and how these steps interact with the inputs described above and databases 808 and 814.

In step 802 the points of interest are entered into database 808. Alternatively, the points of interest may be empirically known to the system, such as an oscilloscope 200 in which the definitions of the points of interest a typical oscilloscope user would be interested in, such as the 10%, 50%, and 90% threshold points, are included as part of the oscilloscope system. Assuming for this example that the points of interest are not known by the system, in step 802 the program checks to see if a point of interest entry is being made, and if one is, it reads it and writes it to database 808. When a signal is received from oscilloscope 200, in step 806 the program 800 finds the current point of interest on the signal. This is done by reading the description of the current point of interest from database 814, finding the location of the point on the signal, and then writing the location back to the database 808 where it is stored in a signal location corresponding to the current point of interest. When a signal and points of interest are input to the system, the current point of interest is defaulted. This default may be preselected by the user, or the user may use a default incorporated into the program. Preferably, the default is the first point of interest. When a user enters a command to move the cursor to a new point of interest, the program, in step 811 finds all the points of interest on the signal. This is done by reading the description of the first point of interest from database 808, finding the location of the point on the signal, and then writing the location back to the database 808 where it is stored in a signal location corresponding to the first point. The program then reads the description of the next point of interest from database 808, finds its position on the signal, and writes it back to database 808 in a location corresponding to the second point of interest, and so on until all points of interest are input into the system. The program, in step 812, reads the next or previous point of interest, as specified by the user, from the database 808 and stores this point in the current point of interest database 814. Then, in step 816, the program reads the current point of interest from database 814 and then reads the location of this point of interest from database 808 to find the current location of the cursor on the signal. It then passes this information to step 603 in which the cursor is displayed at that location. If the signal changes, the new location of the current point of interest is immediately recalculated in step 806 stored in database 808. Step 816 then annotates the location of the current point of interest and passes it to step 603.

Figure 9A:
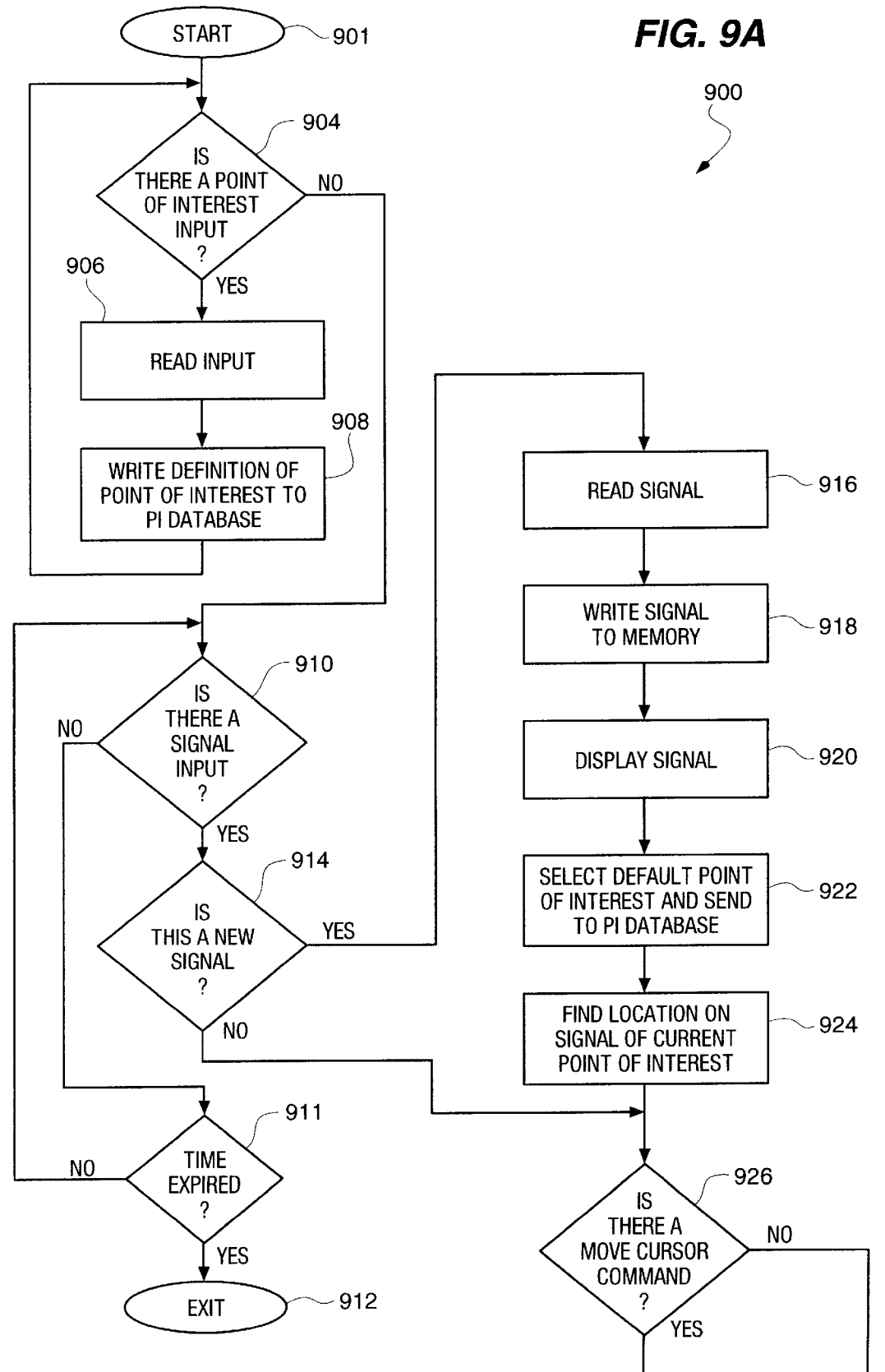
FIGS. 9A and 9B disclose a flow chart describing a software program for moving a marker between predetermined variable points of information on a display.
Figure 9B:
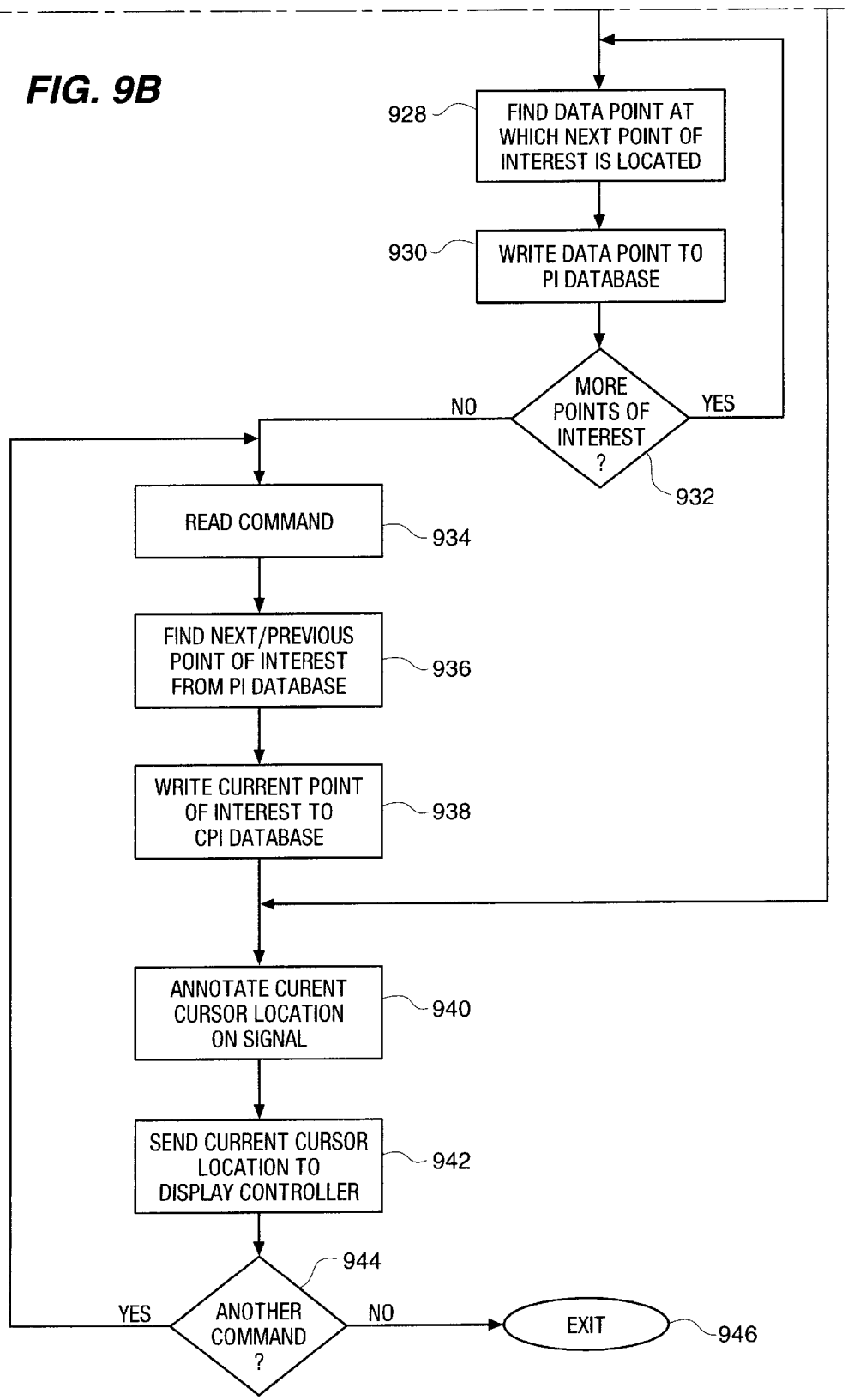

The functionality of FIG. 8 can be embodied in many different programs. A flow chart of an exemplary program 900 that implements the second embodiment of the invention is shown in FIGS. 9A and 9B. The complete flow chart can be seen by placing FIG. 9A above FIG. 9B with the dashed line at the bottom of FIG. 9A overlapping the dashed line on top of FIG. 9B. When this is done, it will be seen that the "YES" path from decision tree 926 in FIG. 9A flows to step 928 in FIG. 9B, while the "NO" path flows to step 940. In discussing this flow chart we shall assume that the user has selected the 10%, 50% and 90% thresholds of the first five rising edges of a signal as the points of interest, or critical points. The program 900 starts at step 901, from an interrupt of the main program or other suitable starting point. In step 904 it first looks to see if a point of interest (PI) has been input into the system. If one has, it reads the input in step 906, and writes the definition of the point of interest to the point of interest (PI) database 808. It then loops back to step 904 and reads and writes the definition of each point of interest entered, i.e. each of the 10%, 50% and 90% thresholds of the first five rising edges, until there are no more to be read. The definitions are such that they can be used by steps 924 and 928 below effectively to find the data points at which the PI's are located. The database is preferably in tabular form. When all the PI's have been read and written to the database 808, the program moves on to step 910. In this step the program checks to see if a signal has been input into the system from oscilloscope 200. If not, the program cycles through step 911 for a predetermined time, e.g. 30 seconds, and then exits the program in step 912. If a signal has been input, the program proceeds to step 914 where it checks the signal against a signal, if any in memory. If the signal is the same as the signal in memory, the program proceeds to step 926, and if it does not match and therefore is a new signal, the program proceeds to step 916 in which the signal is read, and step 918 where the signal is written into memory 303. The signal is then sent to the display controller to be displayed in step 920, and then proceeds to step 922 in which the default PI definition is sent to the current PI database 814. If, for example, the default was set as the central point of interest, i.e. the point of interest closest to the center of the screen 421, or if two points of interest are closest, the leftmost of the two points, the program would find that the 50% threshold of the third rising edge met this definition, and send that data point to the current PI database 814. Step 922 would only happen after power on or some such event to set up the default PI. The program control then moves to step 924 in which the location of the current point of interest on the signal is found and sent to database 808. Preferably the location is stored as the data point at which the point of interest is located, from which information and the signal the cursor location on the signal can be determined when the cursor is to be located at that point of interest. The program then proceeds to step 926 where the program checks to see if a move cursor command has been received in step 601. If no cursor movement command has been entered, the program skips ahead to step 940. If a cursor control command has been entered, the program control proceeds to steps 928 through 932 in which the location of all the points of interest on the signal are found. The data points at which the PI's are located are found in step 928 and written to the PI database in step 930. These steps, 928 and 930 are repeated for each point of interest, until each PI in the database 808 has a corresponding data point associated with it in the database table, at which point step 932 sends the program on to step 934. The command is read in step 934 and in step 936 the command is carried out to select the current point of interest, which will be the next or previous point of interest, e.g., either the 90% threshold of the third rising edge, or the 10% threshold of the third rising edge. The current point of interest is then written to the current point of interest (CPI) database 814 in step 938, and then, in step 940, the program finds, or annotates, the current cursor location by consulting the current point of interest database 814 to find the current point of interest and the point of interest database 808 to find the location on the waveform 424 at which the current point of interest is located. In step 942, the location of the current cursor is sent to the display controller and the cursor is displayed in step 603. The system then checks in step 944 to see if another cursor control command has been received, and if so, loops through steps 934 through 942 until there are no more commands, that is, the user has selected the point of interest he or she desires to examine. The program then exits to the main program in step 946.

In the second embodiment just described, the cursor only indicates one critical value at a time. However, the cursor moves quickly across the screen since the cursor indicates the positions of only the requested critical values. In an alternative of the second embodiment, each critical value is indicated by a different cursor such as cursors 263–264 (FIG. 2). The use of different cursors allows a user to compare the position of different critical values. Either type of display minimizes the number of marker positions needed to study the specified critical values.

A feature of the second embodiment is that the system finds the location of only the current point of interest when a new signal is received, and waits for a move cursor command to find the location of the other points of interest. This minimizes the time required to analyze new signals or other real-time information. It permits the system to respond quickly, in real-time, when a new signal is presented. It also allows the user to switch rapidly between signals to compare them.

A third embodiment of the present invention varies the rate of movement of the marker in real-time responsive to a user input command. As above, in the embodiment to be described, the time for each incremental movement remains the same, and thus this embodiment is effected by varying the incremental amount of an individual marker movement in real-time responsive to a user input command. Again, the third embodiment will be discussed as implemented in a personal computer 300 displaying a waveform from the signals received from attached digital oscilloscope 200.

Figure 10:
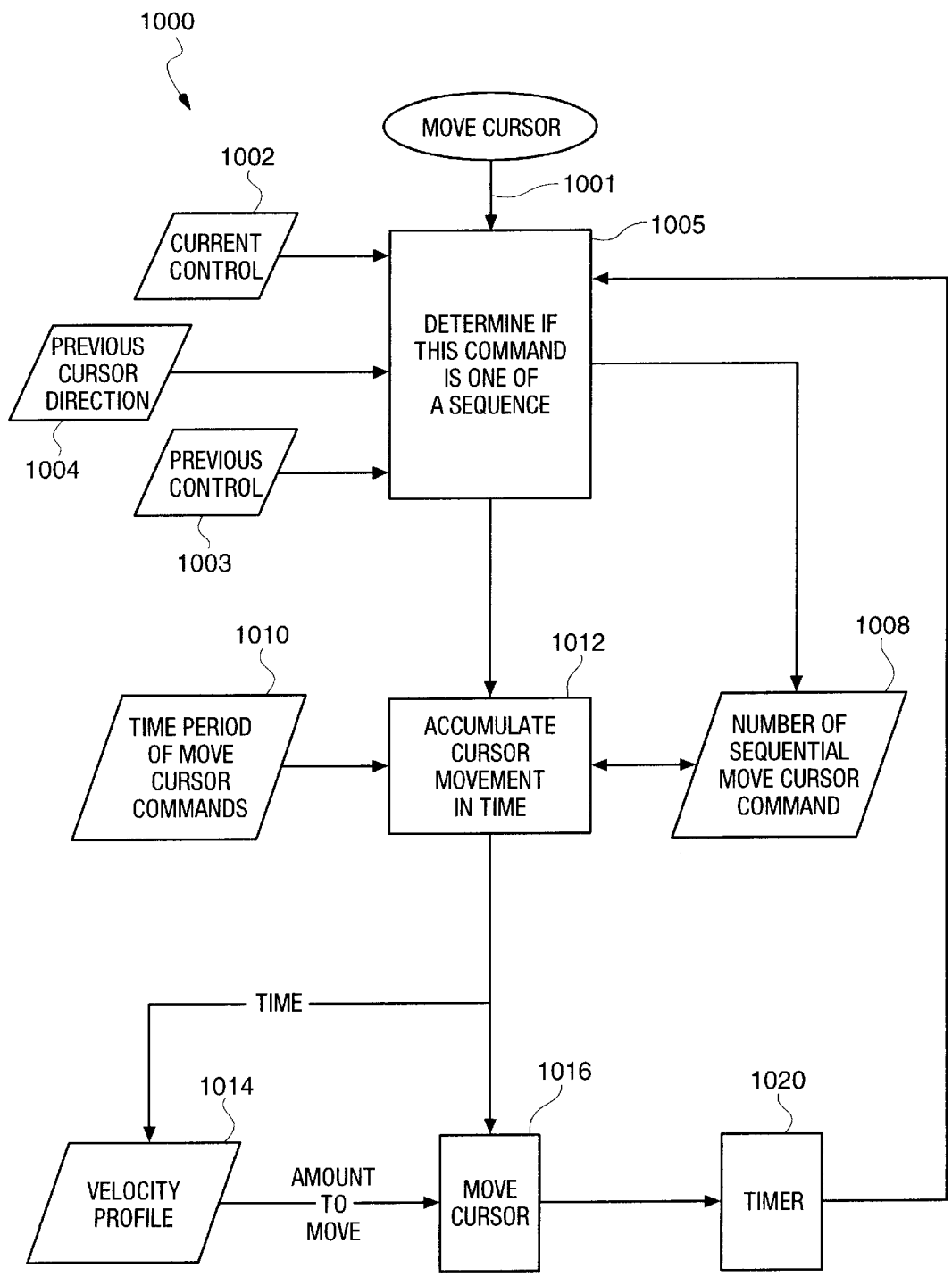
FIG. 10 is a functional flow diagram illustrating the interaction of the principal system elements and process steps according to the invention for changing the rate of movement of the cursor in real-time responsive to user input commands.

FIG. 10 is a functional flow diagram of the third embodiment of the invention, a process 1000 for changing the interval between marker positions, and thus the rate of movement of the cursor, in real-time responsive to user input commands. The process utilizes six "databases", a current control database 1002, a previous control database 1003, a previous cursor direction database 1004, a cursor command number database 1008, a cursor time period database 1010, and a velocity profile database 1014. While these are called "databases" for generality, they are implemented as one or more memory locations in memory 303. They may also be implemented as a register, counter, or other such electronic element that can store information. The current control database 1002 stores the control identifier (ID) of the input control 403, 404, 406, etc. that is providing the current input command received in step 601. The previous control database 1003 stores the control ID for the input control 403, 404, 406, etc. that provided the previous input command received in step 601. The cursor direction database 1004 stores the direction the cursor was commanded to move by the previous command. The cursor command number database 1008 is essentially a counter that stores the number of move cursor commands that have been entered since the counter was reset. The cursor time period database 1010 stores the time for a single move cursor command, which is the inverse of the rate the input 403, 404, 406, etc. is scanned by the system. This period is preferably the same for each input, but may be different, in which case the database is preferably in the form of a table that stores the period for each control ID. The velocity profile database 1014 stores the increments that the cursor is to move as a function of the time that the cursor has been held down. It is preferably a table, that includes a minimum increment corresponding to times that are less than or equal to a certain time, a maximum increment corresponding to times that are greater than or equal to a certain time, and one or more intermediate increments corresponding to intermediate ranges of times. It may also be implemented as an algorithm stored in database 1014 that provides the increments as a function of the time. The system 1000 also includes a timer 1020 that times out after a prescribed time if a cursor command is not provided, so as to indicate that the sequence of cursor commands has been interrupted.

The process 1000 begins by determining, in process step 1005, if the input arriving on path 1001 is the first command in a new series of commands. Timer 1020 provides a time-out function to assist in determining this. The process also determines if the current cursor move command input on path 1001 is coming from the same control as the previous cursor input command, by comparing the control ID stored in the previous control database 1003 with the control ID stored in the current control database 1002, and determines if the user has changed the direction of cursor movement by comparing the direction of the current command with the direction of the previous command stored in database 1104. If the command is the first in a new series, if the control is not the same, or if the direction of cursor movement has changed, the counter that counts the number of cursor commands received sequentially is reset and a minimum increment to move the cursor is selected. If the control and direction are the same, then the total time that the control has been activated is determined in step 1012 by multiplying the period of the move cursor commands for the particular control, which is received from database 1010, by the number of commands stored in database 1008. This total time is used to determine an amount to move, using the velocity profile database, and the cursor is then moved the appropriate amount in step 1016. A timer is initiated to ensure that the move cursor commands are contained in a specific amount of time.

Figure 11:
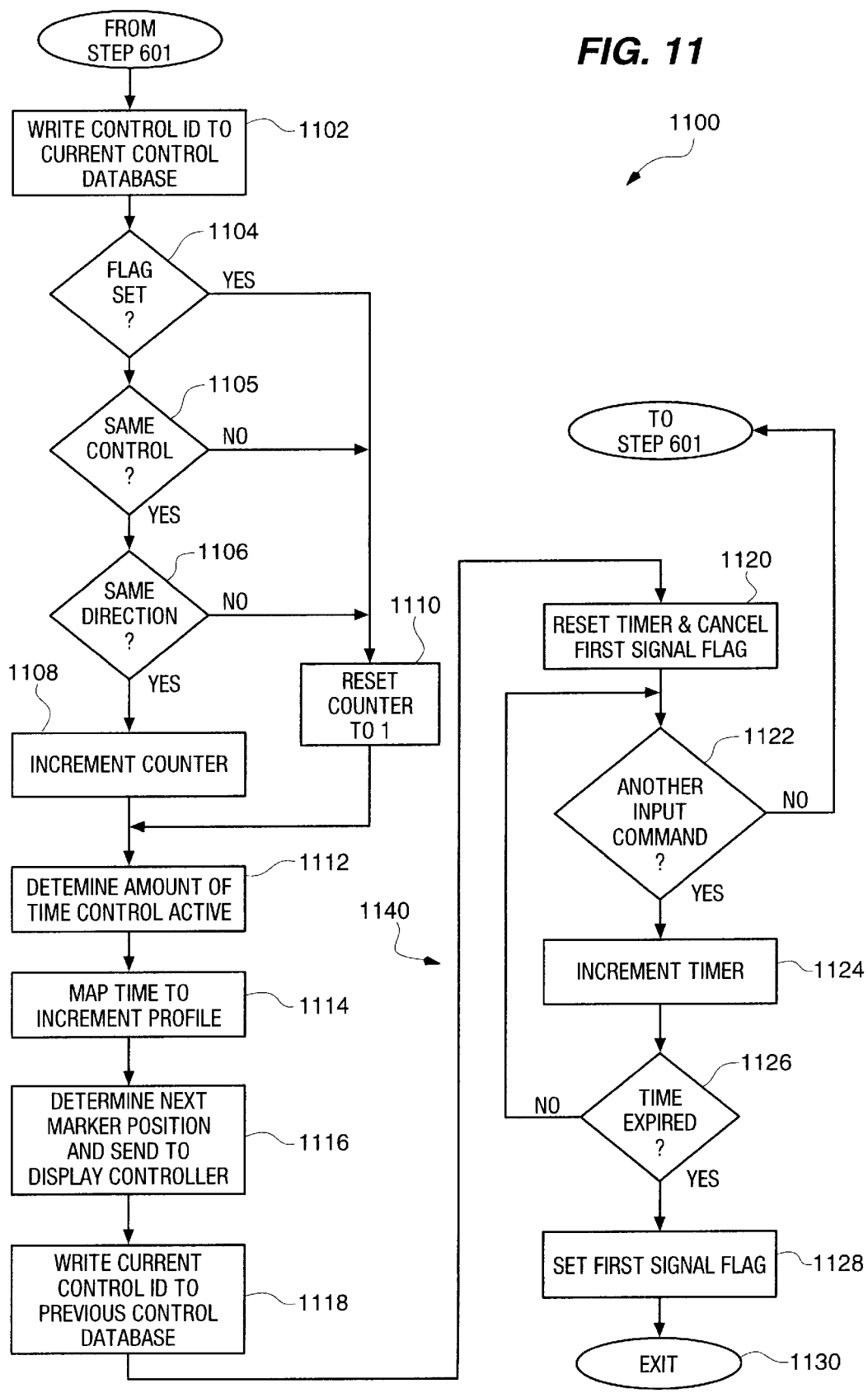
FIG. 11 discloses a flow chart describing the software program for varying marker movement across a display in real-time responsive to user commands.

The above generalized process can be implemented by many different programs. A flow chart of an exemplary program 1100 is shown in FIG. 11. The process 1100 is initiated by step 601 (FIG. 6) in which an input command is received along with the control ID. In step 1102, the control ID is written to current control database 1002. The program then checks to see if the first signal flag is set. The first signal flag is a flag that is set by default each time the system, such as computer 300, is turned on. If this flag is set, the counter 1008 is reset and the program control passes to step 1112. If the first signal flag is not set, the program control passes to step 1105. In step 1105, the program compares the control ID's stored in databases 1002 and 1003, and if they are different, resets the counter in step 1110 and passes the program control to step 1112. If the ID's are the same, the program passes to step 1106 in which the program compares the direction of the current command to the direction of the previous command stored in database 1004. Again, if the directions are not the same, the program resets the counter in step 1110 and passes on to step 1112. If the directions are the same the program control passes to step 1108 in which the counter 1008 is incremented, and then goes to step 1112. In step 1112, the amount of time the control has been activated is determined by multiplying the time period in the database 1010 for the particular input control by the count in counter 1008. In step 1114, this time is then mapped to the cursor movement increment profile in database 1014. An example of this mapping is as follows. The movement increment is one data point for any time up to 500 milliseconds (ms). From 500 ms to 2 seconds, the velocity increases linearly up to a maximum number of data points. An algorithm is used to determine the increment for times in this range. For times greater than 2 seconds, the movement increment remains at the maximum number of data points. Preferably, the maximum is set by the user in a setup program. The maximum is preferably 20 data points, but may be set to any number that is appropriate for the display and the information displayed. In step 1116 the increment found in step 1114 and the present cursor position are used to find the next cursor position, which is sent to the display controller 322 to be displayed in step 603 (FIG. 6).

After the cursor movement has been determined, the system resets itself in preparation for the next cursor control command, in a series of steps 1118 through 1130. In step 1118, the control ID in the current control database 1002 is written to the previous control database 1003. Then the timer 1004 is reset and the first signal flag is canceled. The program then looks for another cursor control command in step 1122. If there is another input command, the program proceeds to step 601 and then repeats program 1100 beginning with step 1102. In this case, the first signal flag will not be set, and the system will continue through step 1104 to step 1106. If there is not another input command immediately, the program will loop through steps 1122 through 1126 until a predefined time has expired. This time is set so that the system distinguishes between a user that is continuing to input a cursor movement command and one that has discontinued inputting a cursor movement command. the time is determined by the type of control that is being used. If a knob is being used, the user will pause occasionally to regrip the knob, even though the user is intending to continue the knob motion. In this case the time will be relatively long, preferably about a half a second. If the control is a keyboard, the time loop 1140 is not used, but rather the first signal flag is set whenever the user releases the cursor movement key. Generally, when the time loop 1140 is used, the time is from one to four times the period stored in database 1010. The time can also be adjusted by the user in the setup of the program. If another input command is received before the time expires, then the program proceeds to step 601 as before. If no input command is received before the time expires, the first signal flag is set in step 1128, and the system exits from the program 1100 in step 1130.

The third embodiment has been described preferably in terms of an input from a keyboard 403. However, it can also accept inputs from other types of input devices, such as a spin control operated by a pointing device 404, or any other appropriate input device or combination of input devices. For other input devices, the preferred time period stored in database 1010, the preferred predefined time counted by timer 1020, and other parameters will generally be different. For example, the period will generally be longer for a spin control device. As in the second embodiment, the third embodiment can also be used in combination with a system that utilizes a plurality of cursors. In this case, another database is used that stores the previous cursor ID, and as the cursor changes, the counter 1108 resets. That is, in this case an additional decision tree is inserted 1105 and 1106 which determines if the cursor is the same. If it is the same, the program control proceeds to step 1106, and if it is not the same, the program control proceeds to step 1110.

In a fourth embodiment of the invention, personal computer 300 executes commands stored in memory 302 that temporarily interrupts the receiving of input commands when a marker is positioned at specified detent values in the displayed information. This embodiment has also been implemented in the apparatus of FIGS. 3, 4 and 5, namely a personal computer with an input from an attached digital oscilloscope 200. Detent values are positions in variable displayed information where users typically desire to stop marker movement. The term detent does not include the end values of the marker movement; for example, if a marker has the ability to move across a screen from a zero position to an end position, which say has the value ten, the end values, zero and ten, are not included in the term detent. That is, herein, a detent value is different than an end value. As an example of detent values, a knob 407 (FIG. 4) is used to sweep through a range of 2.0 to −2.0 in increments of 0.001. The values 0.0, 1.0, and −1.0 are values that are commonly selected for various purposes. These are the detent values. As the knob 407 is turned, the cursor will begin stepping in 0.001 increments. The increment is increased, as discussed in embodiment three above, to cause acceleration of the cursor based upon how long the knob 407 has been turning. When the marker steps into or over one of the detent values, 1.0, 0.0, or −1.0, the fourth embodiment causes the stepping to pause for a period of time, typically one-half to one second. This allows the user time to react and stop turning the knob when the desired detent values are achieved. That is, this embodiment allows to the user to stop at an exact detent value, even if the velocity of the cursor, as determined by embodiment three or some other method, would cause the cursor to skip over the detent value. Continuing to turn the knob will resume stepping the marker after the detent time-out time.

Figure 12:
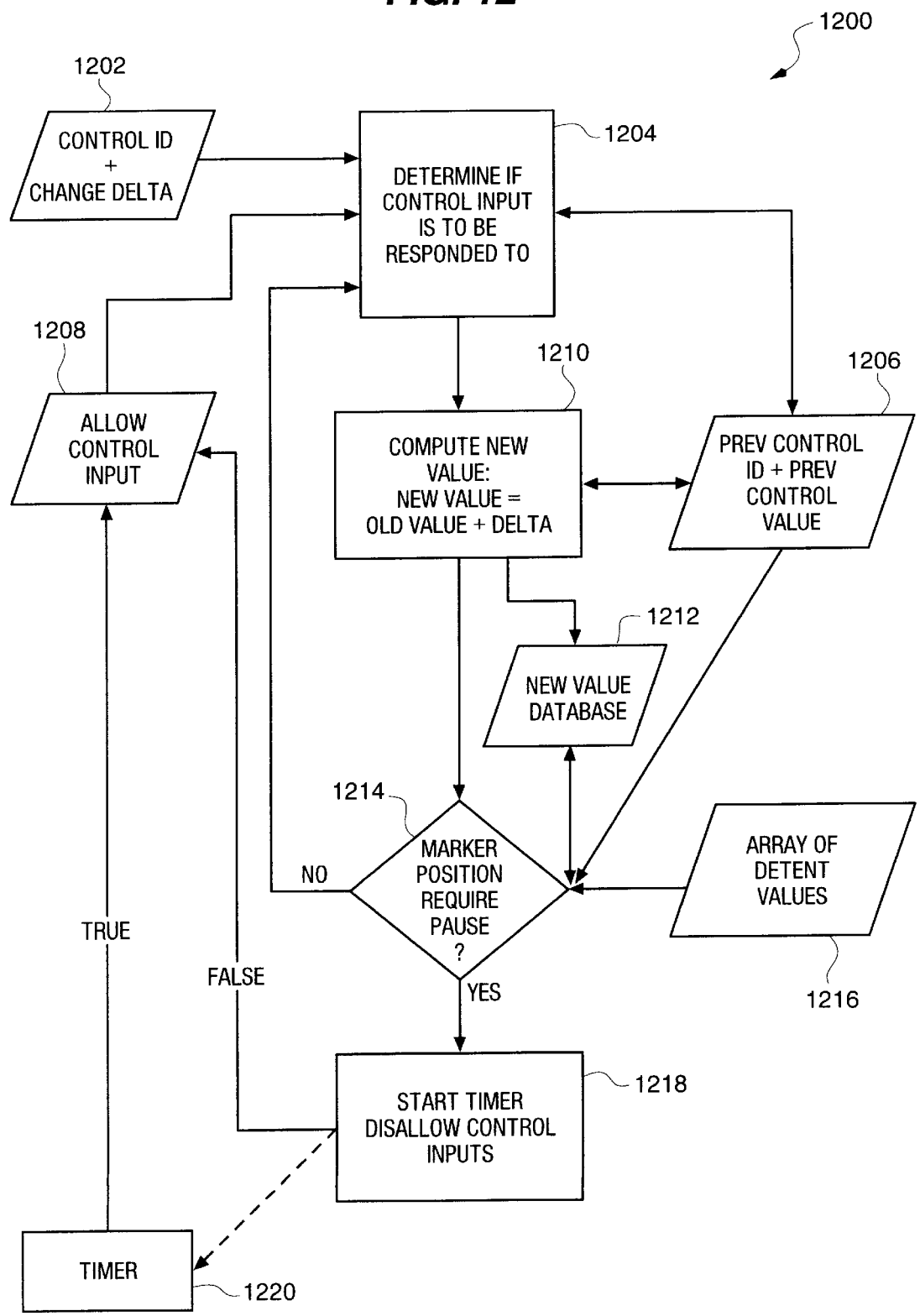
FIG. 12 is a functional flow diagram illustrating the interaction of the principal system elements and process steps according to the invention for pausing the movement of a marker at detent values on variable information on a display.

FIG. 12 is a functional flow diagram 1200 showing the interaction of the principal system elements and principal program steps for the fourth embodiment of the invention that causes the marker to pause at predetermined detent values on displayed information that is variable. The system 1200 includes up to five databases: a control database 1202, a previous database 1206, an input status database 1208, a new value database 1212, and a detent database 1216. As before these databases are preferably implemented as one or more memory locations in memory 303, and, alternatively be implemented as a register, a latch, a counter, or other elements for storing information. Control database 1202 stores the control ID for the current control as well as a change delta corresponding to the amount of marker movement commanded by the control in the current input. Previous database 1206 stores the control ID for the control that provided the previous input, as well as the previous value of the marker, preferably the position along a one-dimensional movement range of the cursor to which the cursor was moved by the previous control input. New value database 1212 stores the new value of the cursor position, after it is incremented by the change delta. Detent database 1216 stores an array of detent values, and the input status database 1208 stores the current status of the input control, which is either allow input (true) or do not allow input (false). The principal process of the system 1200 is to determine in step 1204 if the control ID and change delta stored in database 1202 are to be accepted by the system or not to be accepted by the system. This depends on the state of the system. If the input status database 1208 holds a false status, the control input is not accepted. If the current control ID changes during a pause period, the pause will be ended and the cycle will restart. Upon acceptance, the current control ID is stored in the previous control database 1206. Step 1210 computes the new value by adding the change delta to the previous value. This new position value is also stored in new value database 1212. Another principal function of the system 1200 is to determine if the marker position requires a pause to be made. This is determined in step 1214 from the data in the new value database 1212, the previous database 1206, and the detent database 1216. A pause is required if the new value has crossed a detent value relative to the previous value. When a pause is required, the new value database 1212 is reassigned the detent value. If a pause is required, a false status is written in input status database 1208 and a timer 1220 is started. When timer 1220 times out, a true system status is written in input status database 1208.

The system 1200 can be entered at either step 1204, 1210, or 1214. In the preferred embodiment, the system 1200 is entered before the marker has been moved. That is, the system is designed so that if an increment of the marker would take the marker up to or beyond the detent value, the system pauses. A flow chart showing an exemplary embodiment of this process 1300 is disclosed in FIG. 13. The process 1300 is entered from step 601 (FIG. 6) in which an input command and change delta is received along with the control ID. In step 1302 the control ID and change delta are written to the control database 1202. In step 1304, the program compares the control ID in the control database 1202 with the previous control in previous database 1206. Alternatively, or in combination with this step, the program looks to see if the direction of movement has been changed, and if so, the same action can be taken as if the control ID's do not match. If the ID's are not the same, then the allow control input database 1208 is set to true in step 1308. If the ID's are the same, then the allow control input database 1208 is examined in step 1310 to determine if inputs are being accepted. If allow control inputs is false, then the program checks to see if the time has expired in step 1312 and continues to accept new input in step 1302, without responding to it, and increment the timer in step 1326 until the time has expired or a new control is used. If the timer has expired in step 1312, then the allow control input database 1208 value is set to true in step 1308. Control is then passed back to step 1310. If allow control input is true, step 1314 gets the first detent value from database 1216 and uses this value to determine if the increment of the marker commanded in step 601 will move the marker beyond the detent value and therefore a pause is required. That is, if the old value was less than the detent and the new value is equal to or greater than the detent, or if the old value was greater than the detent and the new value is less than or equal to the detent, then a pause is required. If a pause is not required, then detent database 1216 is interrogated to determine if another detent value exists in step 1318, and if so, the next detent value is obtained in step 1314 and this value is tested in step 1316. This continues until either there are no more detents to be tested or a pause is required. If there are no more detents to be tested, the program control passes to step 603. If a pause is required, the new control value is set to the detent value in step 1320. This allows the cursor to stop exactly on the detent value. The allow control input flag is set to false in step 1322 to cause the pause to happen. Then the interrupt event is begun in step 1324 by activating time 1220. The timer increments in step 1326, and will continue incrementing until the time has elapsed.

Figure 13:
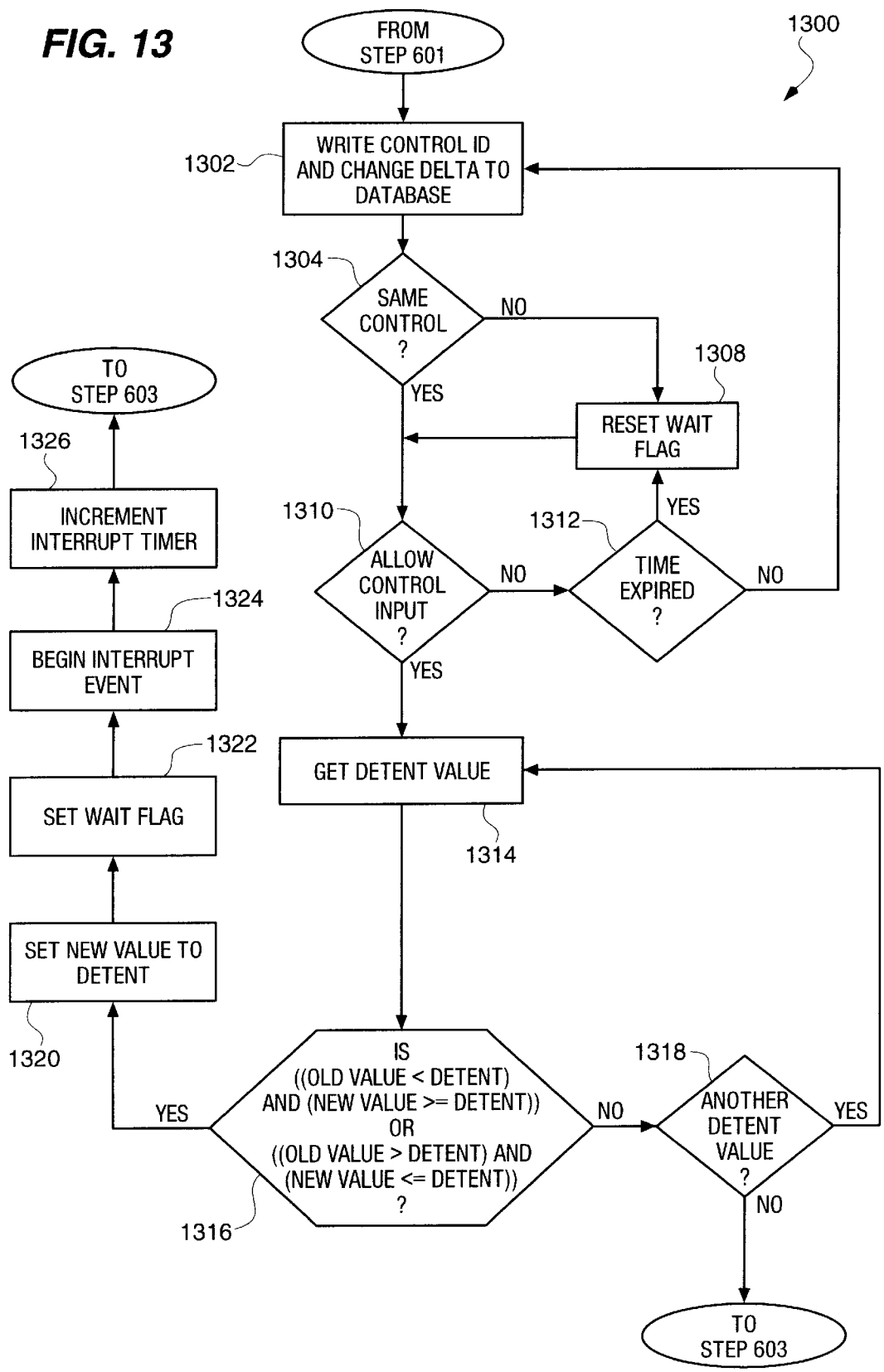
FIG. 13 discloses a flow chart describing the software program pausing the movement of a marker at detent values on variable information on a display.

In the embodiment of the process shown in FIG. 13, the cursor is moved until it lands on or the next movement will go beyond the detent value. In an alternative embodiment movement is denied only after an increment moves the cursor beyond a detent value. This is done by entering the process of FIG. 12 after the movement of the marker. From the above discussions, those skilled in the art will know how to vary the process of FIG. 13 to accommodate this alternative.

The above preferred embodiments are explanations of the present invention and are not meant to limit the claims.

There has been described a novel smart cursor that permits the user to examine areas of interest on a display in detail while moving quickly across areas of the display that are less interesting and has many other advantages. It is evident that, now that the invention has been fully disclosed, those skilled in the art may now make numerous uses and modifications of the specific embodiment described, without departing from the inventive concepts. For example, now that four very different variations of the system according to the invention have been disclosed in detail, new variations may be devised, the four systems may be combined and/or varied, and may be combined with other variations. The systems described above may be used for any type of electronic display. Further, any type of input device and any method of measuring the input may be used in these methods to move the marker across the screen. Or equivalent components or circuits can be substituted for the various components and circuits described. Additional features may be added. A greater or lesser number of parts may be used. Consequently, the invention is to be construed as embracing each and every novel feature and novel combination of features present in and/or possessed by the smart cursor system disclosed.

I claim:

1. A computer-readable medium on which is stored a program for controlling movement of a marker on an electronic display, said computer program comprising instructions, which when executed by a computer, perform method steps comprising:

providing electronic information signals corresponding to information to be displayed on a said electronic display, said information including real-time variable base visual information and a marker;

responsive to said electronic information signals, generating visual information on said electronic display, said visual information including said real-time variable base visual information and said marker;

receiving from a manual input device a plurality of marker movement command signals;

moving said marker a marker movement increment in response to each of said plurality of marker movement command signals; and performing in real-time a function selected from the group consisting of:

a) changing said marker movement increment based on information from the information group consisting of:
i) said real-time variable base visual information and the position of said marker on said display in relation to said real-time variable base visual information; and
ii) said plurality of marker movement command signals; and b) interrupting said response to said marker movement command signals based on said real-time variable base visual information and the position of said marker on said display in relation to said real-time variable base visual information.

2. A computer-readable medium on which is stored a computer program as in claim 1 wherein said marker movement increment comprises a spacial increment.

3. A computer-readable medium on which is stored a computer program as in claim 2 wherein said marker movement increment comprises the incremental distance said marker moves per unit time.

4. A computer-readable medium on which is stored a computer program as in claim 1, wherein said step of performing comprises changing said marker movement increment based on said real-time variable base visual information and the position of said marker on said display in relation to said real-time variable base visual information.

5. A computer-readable medium on which is stored a computer program as in claim 4 wherein said visual basic information contains a first area of greater interest to a user and a second area of lesser interest to said user, and said step of changing comprises varying said marker movement increment so that said marker moves in a first distance increment in said first area and moves in a second distance increment in said second area, and wherein said second distance increment is greater than said first distance increment.

6. A computer-readable medium on which is stored a computer program as in claim 4 wherein said step of changing said marker movement increment comprises:
   determining a range of marker locations;
   finding a provisional movement increment for a plurality of marker locations within said range; and
   selecting said marker movement increment to be the minimum of said provisional movement increments.

7. A computer-readable medium on which is stored a computer program as in claim 4 wherein said visual basic information changes at a first rate in a first area of said display and changes at a second rate greater than said first rate in a second area of said display and said step of changing comprises varying said marker movement increment so that said marker moves in a first distance increment in said first area of said electronic display and moves in a second distance increment in said second area of said electronic display, and wherein said second distance increment is smaller than said first distance increment.

8. A computer-readable medium on which is stored a computer program as in claim 7 wherein said step of varying comprises determining said increment by applying a mathematical algorithm to said base visual information.

9. A computer-readable medium on which is stored a computer program as in claim 8 wherein said base visual information comprises a waveform amplitude displayed on said display and said step of applying comprises finding the differential of said waveform amplitude with respect to time.

10. A computer-readable medium on which is stored a computer program as in claim 9 wherein said marker movement increment is proportional to the reciprocal of said differential for at least a portion of the movement of said marker.

11. A computer-readable medium on which is stored a computer program as in claim 10 wherein said movement increment is set equal to a maximum value for values of said reciprocal greater than a predetermined value.

12. A computer-readable medium on which is stored a computer program as in claim 10 wherein said marker movement increment is scaled between a minimum value and a maximum value.

13. A computer-readable medium on which is stored a computer program as in claim 4 wherein said visual basic information includes at least one point of interest to said user, said step of changing comprises identifying in real-time said at least one point of interest, and said step of moving comprises moving said marker to said point of interest in response to one of said marker movement command signals.

14. A computer-readable medium on which is stored a computer program as in claim 13 wherein said step of identifying comprises tracking said point of interest in real time as said visual basic information changes in real-time.

15. A computer-readable medium on which is stored a computer program as in claim 13 wherein said visual basic information comprises a waveform and said point of interest comprises a specific point on said waveform.

16. A computer-readable medium on which is stored a computer program as in claim 15 wherein said specific point on said waveform comprises a point selected from the group consisting of: a local minimum of the waveform, a local maximum of waveform, an overall minimum of the waveform, an overall maximum of the waveform, and a percentage threshold of a waveform edge.

17. A computer-readable medium on which is stored a computer program as in claim 1, wherein said step of performing comprises changing said marker movement increment based on said plurality of marker movement command signals.

18. A computer-readable medium on which is stored a computer program as in claim 17, wherein said step of changing comprises varying said increment depending on the length of time said manual input device has been activated.

19. A computer-readable medium on which is stored a computer program as in claim 18 wherein said manual input device comprises a key on a keyboard and said increment depends on the length of time said key has been depressed.

20. A computer-readable medium on which is stored a computer program as in claim 18 wherein said step of varying comprises providing a minimum movement increment when said manual device has been activated for a time less than a minimum predetermined time, providing a maximum movement increment when said manual device has been activated for a time less than a maximum predetermined time, and providing an intermediate movement increment when said manual device has been activated for a time intermediate said minimum and maximum predetermined times.

21. A computer-readable medium on which is stored a computer program as in claim 1, wherein said step of performing comprises interrupting said response to said marker movement command signals based on said real-time variable base visual information and the position of said marker on said display in relation to said real-time variable base visual information.

22. A computer-readable medium on which is stored a computer program as in claim 21, wherein said visual basic information comprises at least one detent value and said step of interrupting comprises pausing said marker movement when said marker is at a location selected from the group consisting of: a location at said detent value; a location at which the next increment will move said marker past said detent value; a location at which the previous movement of the marker moved it past said detent value.

23. A computer-readable medium on which is stored a computer program as in claim 21 and further comprising the step of terminating said interrupting step when one of the following has occurred: a marker movement command signal is received indicating that a new manual input device has been activated; and a marker movement command is received reversing the direction of movement of said marker.

24. A computer-readable medium on which is stored a computer program as in claim 21 wherein said step of interrupting comprises pausing said marker movement for a time between one-half second and five seconds.

25. A computer-readable medium on which is stored a computer program as in claim 1 wherein said movement increment comprises a minimum increment, a maximum increment, and at least one intermediate increment.

26. A computer-readable medium on which is stored a computer program as in claim 1 wherein said manual input device comprises a device selected from the group consisting of a keyboard, a knob, a spin control, a mouse, a joy stick, a touch pad, and a roller ball.

27. A method for controlling movement of a marker on an electronic display, said method comprising:

providing electronic information signals corresponding to information to be displayed on a said electronic display, said information including real-time variable base visual information and a marker;

responsive to said electronic information signals, generating visual information on said electronic display, said visual information including said real-time variable base visual information and said marker;

receiving from a manual input device a marker movement command signal;

determining in real-time a marker movement increment dependent on information selected from the group consisting of: i) said real-time variable base visual information and the position of said marker on said display in relation to said real-time variable base visual information; and ii) said marker movement command signal and a previous marker movement command signal; and incrementing said marker movement increment in response to said marker movement command signal.

28. A method as in claim 27 wherein said step of determining comprises determining in real-time a marker movement increment dependent on said real-time variable base visual information and the position of said marker on said display in relation to said real-time variable base visual information.

29. A method as in claim 28 wherein said marker movement increment comprises the incremental distance said marker moves per unit time.

30. A method as in claim 28 wherein said step of changing said marker movement increment comprises:

determining a range of marker locations;

finding a provisional movement increment for a plurality of marker locations within said range; and selecting said marker movement increment to be the minimum of said provisional movement increments.

31. A method as in claim 28 wherein said visual basic information contains a first area of greater interest to a user and a second area of lesser interest to said user, and said step of changing comprises varying said marker movement increment so that said marker moves in a first distance increment in said first area and moves in a second distance increment in said second area, and wherein said second distance increment is greater than said first distance increment.

32. A method as in claim 28 wherein said visual basic information includes at least one point of interest to said user, said step of determining comprises identifying in real-time said at least one point of interest, and said step of incrementing comprises moving said marker to said point of interest in response to said marker movement command signal.

33. A method as in claim 28 wherein said visual basic information includes a detent and said step of determining comprises identifying in real time the location of said marker with respect to said detent and finding a marker movement increment of zero if said marker is at a predetermined position with respect to said detent.

34. A method as in claim 33 wherein said predetermined position comprises a location selected from the group consisting of: a location at said detent; a location at which the next increment will move said marker past said detent; a location at which the previous movement of the marker moved it past said detent.

35. A method as in claim 27 wherein said step of determining comprises determining in real-time a marker movement increment dependent on said marker movement command signal and a previous marker movement command signal.

36. A method as in claim 35 wherein said step of determining comprises said finding said increment based on the length of time said manual input device has been activated.

37. A method as in claim 36 wherein said length of time is found by counting the number of said marker movement commands and multiplying by the time period for each command.

38. A method as in claim 27 wherein said base visual information is a waveform and said step of determining comprises finding said marker movement increment based on the form of said waveform.

39. An electronic display system comprising:

a display for displaying information, said information including real-time variable base visual information and a marker movable across said display to indicate a particular part of said base visual information, an input device for inputting marker movement commands;

a memory for storing instructions for moving said marker across said display;

an electronic processor communicating with said display and said memory for determining in real-time a marker movement increment dependent on information selected from the group consisting of: i) said real-time variable base visual information and the position of said marker on said display in relation to said real-time variable base visual information; and ii) a plurality of said marker movement commands; and an electronic display controller communicating with said processor for moving said marker said determined marker movement increment in response to one of said marker movement commands.

40. An electronic display system as in claim 39 wherein said memory includes a memory location for storing a factor related to the differential of said real-time variable base visual information for at least one position on said display, and said processor determines said marker increment based on said factor.

41. An electronic display system as in claim 39 wherein said memory includes locations for storing criteria for determining in real-time the location on said display of a point of interest to the user, and said processor determines said marker movement increment based on the location of said point of interest.

42. An electronic display system as in claim 39 wherein said base visual information includes a waveform and said point of interest comprises a point selected from the group consisting of: a local minimum of the waveform, a local maximum of waveform, an overall minimum of the waveform, an overall maximum of the waveform, and a percentage threshold of a waveform edge.

43. An electronic display system as in claim 39 wherein said memory includes a memory location for storing a minimum marker movement increment and a memory location for storing a maximum marker movement increment.

44. An electronic display system as in claim 39 wherein said system includes a counter for counting the number of said marker movement commands and said processor determines said marker movement increment based on the number of counts in said counter.

45. An electronic display system as in claim 39 wherein said memory includes a location for storing a factor related to the length of time said input device has been activated and said processor determines said marker movement increment based on said length of time.

46. An electronic display system as in claim 45 wherein said input device comprises a key on a keyboard and said processor determines said increment based on the length of time said key has been depressed.

47. An electronic display system as in claim 39 wherein said real time variable base visual information includes a detent and said system includes a timer for timing a pause in the movement of said marker when said marker is at or near said detent.

48. An electronic display system as in claim 39 wherein said input device comprises a device selected from the group consisting of a keyboard, a knob, a spin control, a mouse, a joy stick, a touch pad, and a roller ball.

49. An electronic display system as in claim 39 wherein said memory includes a location for storing an identifier identifying the input device that provided the current movement command and a location for storing an identifier identifying the input device that provided a previous movement command, and said processor determines the moment of said marker based on whether said device that provided said current marker movement command is the same as the device that provided said previous marker movement command.

50. An oscilloscope comprising:
   a display for displaying a waveform and a marker;
   an input device for inputting marker movement commands;
   a memory for storing instructions for moving said marker along said waveform;
   an electronic processor communicating with said display and said memory for determining in real-time a marker movement increment dependent on information selected from the group consisting of: i) said waveform; ii) the position of said marker on said waveform; and iii) a plurality of said marker movement commands; and
   an electronic display controller communicating with said processor for moving said marker said determined marker movement increment in response to one of said marker movement commands.

51. An oscilloscope as in claim 50 wherein said memory includes a memory location for storing a factor related to the differential of said waveform and said increment is based on said factor.

52. An oscilloscope as in claim 50 wherein said memory includes locations for storing criteria for determining in real-time the location on said waveform of a point of interest to the user, and said processor determines said marker movement increment based on the location of said point of interest.

53. An oscilloscope as in claim 50 wherein said point of interest comprises a point selected from the group consisting of: a local minimum of the waveform, a local maximum of the waveform, an overall minimum of the waveform, an overall maximum of the waveform, and a percentage threshold of a waveform edge.

54. An oscilloscope as in claim 50 wherein said memory includes a memory location for storing a minimum marker movement increment and a memory location for storing a maximum marker movement increment.

55. An oscilloscope as in claim 50 wherein said system includes a counter for counting the number of said marker movement commands and said processor determines said marker movement increment based on the number of counts in said counter.

56. An oscilloscope as in claim 50 wherein said memory includes a location for storing a factor related to the length of time said input device has been activated and said processor determines said marker movement increment based on said length of time.

57. An oscilloscope as in claim 50 wherein said input device comprises a key on a keyboard and said processor determines said increment based on the length of time said key has been depressed.

58. An oscilloscope as in claim 50 wherein said display includes a detent and said system includes a timer for timing a pause in the movement of said marker when said marker is at or near said detent.

59. An oscilloscope as in claim 50 wherein said input device comprises a device selected from the group consisting of a keyboard, a knob, a spin control, a mouse, a joy stick, a touch pad, and a roller ball.

60. An oscilloscope as in claim 50 wherein said memory includes a location for storing an identifier identifying the input device that provided the current movement command and a location for storing an identifier identifying the input device that provided a previous movement command, and said processor determines the moment of said marker based on whether said device that provided said current marker movement command is the same as the device that provided said previous marker movement command.

* * * * *